United States Patent [19]

Cheng et al.

[11] Patent Number: 5,559,990
[45] Date of Patent: Sep. 24, 1996

[54] MEMORIES WITH BURST MODE ACCESS

[75] Inventors: Pearl P. Cheng, Cupertino; Michael S. Briner; James C. Yu, both of San Jose, all of Calif.

[73] Assignee: Advanced Micro Devices, Inc., Sunnyvale, Calif.

[21] Appl. No.: 328,337

[22] Filed: Oct. 24, 1994

Related U.S. Application Data

[63] Continuation of Ser. No. 836,667, Feb. 14, 1992, abandoned.

[51] Int. Cl.$^6$ ........................................ G06F 12/00
[52] U.S. Cl. ............... 395/484; 395/421.07; 395/405; 364/DIG. 1; 365/230.04; 365/230.08
[58] Field of Search ........................... 395/425, 500, 395/484, 405, 421.07, 401, 481; 365/230, 230.04, 230.08, 238.5

[56] References Cited

U.S. PATENT DOCUMENTS

| | | | |
|---|---|---|---|
| 4,347,587 | 8/1982 | Rao | 365/189 |
| 4,513,372 | 4/1985 | Ziegler et al. | 365/230.03 |
| 4,621,320 | 11/1986 | Holste et al. | 395/425 |
| 4,636,986 | 1/1987 | Pinkham | 365/195 |
| 4,680,738 | 7/1987 | Tam | 365/189.02 |
| 4,805,094 | 2/1989 | Oye et al. | 395/25 |
| 4,811,297 | 3/1989 | Ogawa | 365/189.02 |
| 4,833,657 | 5/1989 | Tanaka | 365/230.04 |
| 4,849,937 | 7/1989 | Yoshimoto | 365/189.05 |
| 4,872,143 | 10/1989 | Sumi | 365/233.5 |
| 4,954,987 | 9/1990 | Auvinen et al. | 365/189.02 |
| 5,051,889 | 9/1991 | Fung et al. | 395/425 |
| 5,146,582 | 9/1992 | Begun | 395/500 |
| 5,241,510 | 8/1993 | Kobayashi et al. | 365/230.03 |
| 5,280,594 | 1/1994 | Young et al. | 395/425 |

OTHER PUBLICATIONS

*Choosing Memory Architectures to Balance Cost and Performance*, Microprocessor Reports, vol. 2, No. 9, pp. 6–9, (Sep. 1988).
C. A. Holt, *Electronic Circuits* (John Wiley & Sons, 1978), p. 293.
John F. Wakerly, *Digital Design: Principles and Practices* (Prentice–Hall, 1990), pp. 123, 126–127, 246–254 and 567–568.

*Primary Examiner*—Rebecca L. Rudolph
*Attorney, Agent, or Firm*—Skjerven, Morrill, MacPherson, Franklin & Friel; Michael Shenker

[57] ABSTRACT

To provide a boundaryless burst mode access, a memory array is divided into two or more subarrays. Each subarray has its own row and column decoders. The columns of each subarray are divided into groups. A sense amplifier circuit is provided for each group of columns. The column decoder of each subarray selects simultaneously one column from each group so that the memory locations in one row in the selected columns have consecutive addresses. The memory locations in the selected row and columns are read by the sense amplifier circuits. While the contents of the sense amplifier circuits of one subarray are transferred one by one to the memory output, consecutive memory locations of another subarray are read to the sense amplifier circuits. In some embodiments, to save power, sense amplifier circuits are disabled when their outputs are not transferred to the memory output.

23 Claims, 37 Drawing Sheets

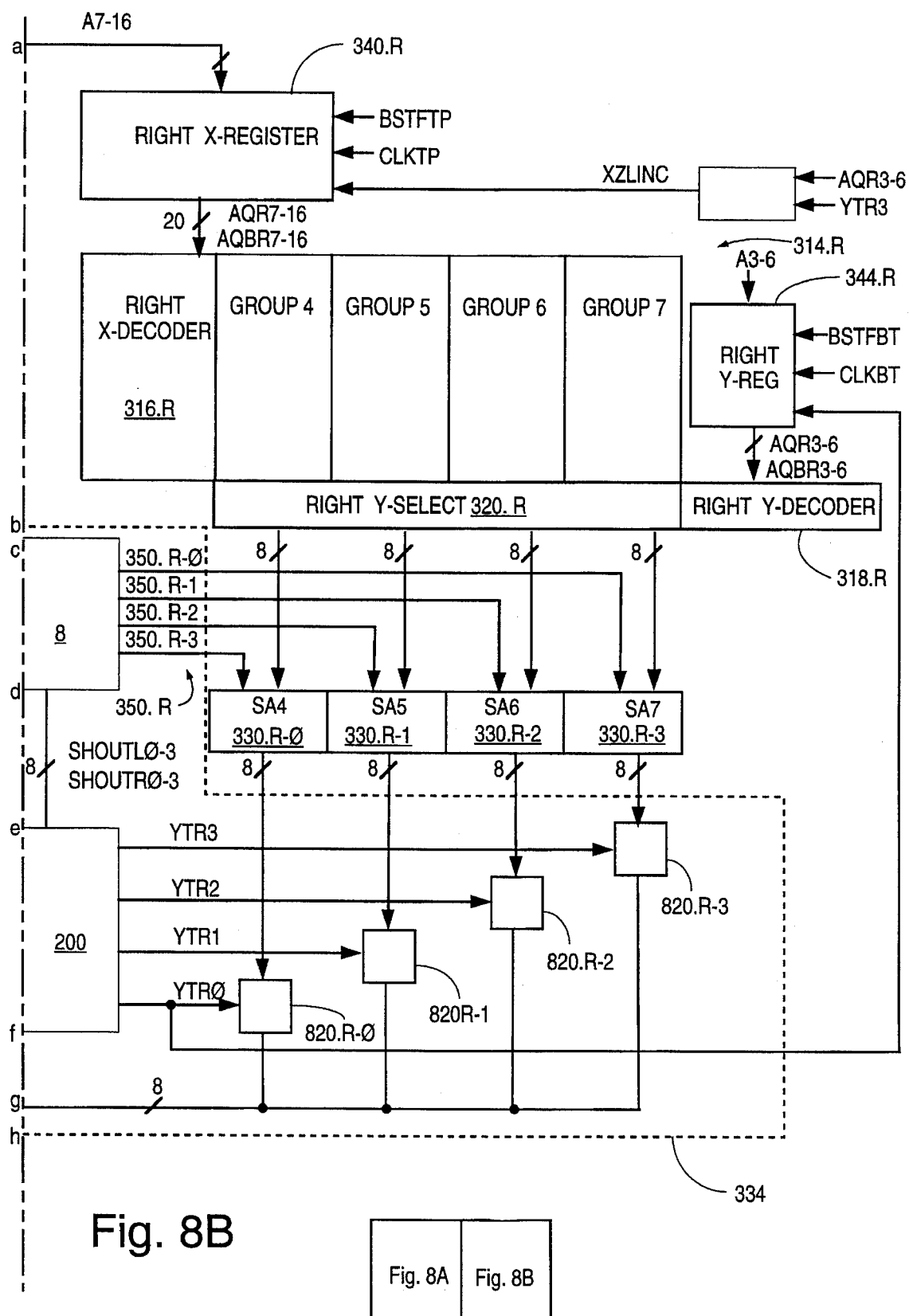
Fig. 8B
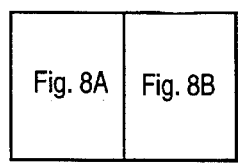

SUBARRAY 314.L

| | PHYSICAL COLUMN NO. | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|---|
| GROUP 0 | LOGICAL COLUMN NO. | 0 | 8 | 16 | 24 | 32 | 40 | 48 | 56 | 64 | 72 | 80 | 88 | 96 | 104 | 112 | 120 |
| GROUP 1 | PHYSICAL COLUMN NO. | 16 | 17 | 18 | 19 | 20 | 21 | 22 | 23 | 24 | 25 | 26 | 27 | 28 | 29 | 30 | 31 |
|  | LOGICAL COLUMN NO. | 1 | 9 | 17 | 25 | 33 | 41 | 49 | 57 | 65 | 73 | 81 | 89 | 97 | 105 | 113 | 121 |
| GROUP 2 | PHYSICAL COLUMN NO. | 32 | 33 | 34 | 35 | 36 | 37 | 38 | 39 | 40 | 41 | 42 | 43 | 44 | 45 | 46 | 47 |
|  | LOGICAL COLUMN NO. | 2 | 10 | 18 | 26 | 34 | 42 | 50 | 58 | 66 | 74 | 82 | 90 | 98 | 106 | 114 | 122 |
| GROUP 3 | PHYSICAL COLUMN NO. | 48 | 49 | 50 | 51 | 52 | 53 | 54 | 55 | 56 | 57 | 58 | 59 | 60 | 61 | 62 | 63 |
|  | LOGICAL COLUMN NO. | 3 | 11 | 19 | 27 | 35 | 43 | 51 | 59 | 67 | 75 | 83 | 91 | 99 | 107 | 115 | 123 |

SUBARRAY 314.R

| | PHYSICAL COLUMN NO. | 64 | 65 | 66 | 67 | 68 | 69 | 70 | 71 | 72 | 73 | 74 | 75 | 76 | 77 | 78 | 79 |
|---|---|---|---|---|---|---|---|---|---|---|---|---|---|---|---|---|---|
| GROUP 4 | LOGICAL COLUMN NO. | 4 | 12 | 20 | 28 | 36 | 44 | 52 | 60 | 68 | 76 | 84 | 92 | 100 | 108 | 116 | 124 |
| GROUP 5 | PHYSICAL COLUMN NO. | 80 | 81 | 82 | 83 | 84 | 85 | 86 | 87 | 88 | 89 | 90 | 91 | 92 | 93 | 94 | 95 |
|  | LOGICAL COLUMN NO. | 5 | 13 | 21 | 29 | 37 | 45 | 53 | 61 | 69 | 77 | 85 | 93 | 101 | 109 | 117 | 125 |
| GROUP 6 | PHYSICAL COLUMN NO. | 96 | 97 | 98 | 99 | 100 | 101 | 102 | 103 | 104 | 105 | 106 | 107 | 108 | 109 | 110 | 111 |
|  | LOGICAL COLUMN NO. | 6 | 14 | 22 | 30 | 38 | 46 | 54 | 62 | 70 | 78 | 86 | 94 | 102 | 110 | 118 | 126 |
| GROUP 7 | PHYSICAL COLUMN NO. | 112 | 113 | 114 | 115 | 116 | 117 | 118 | 119 | 120 | 121 | 122 | 123 | 124 | 125 | 126 | 127 |
|  | LOGICAL COLUMN NO. | 7 | 15 | 23 | 31 | 39 | 47 | 55 | 63 | 71 | 79 | 87 | 95 | 103 | 111 | 119 | 127 |

Fig. 9

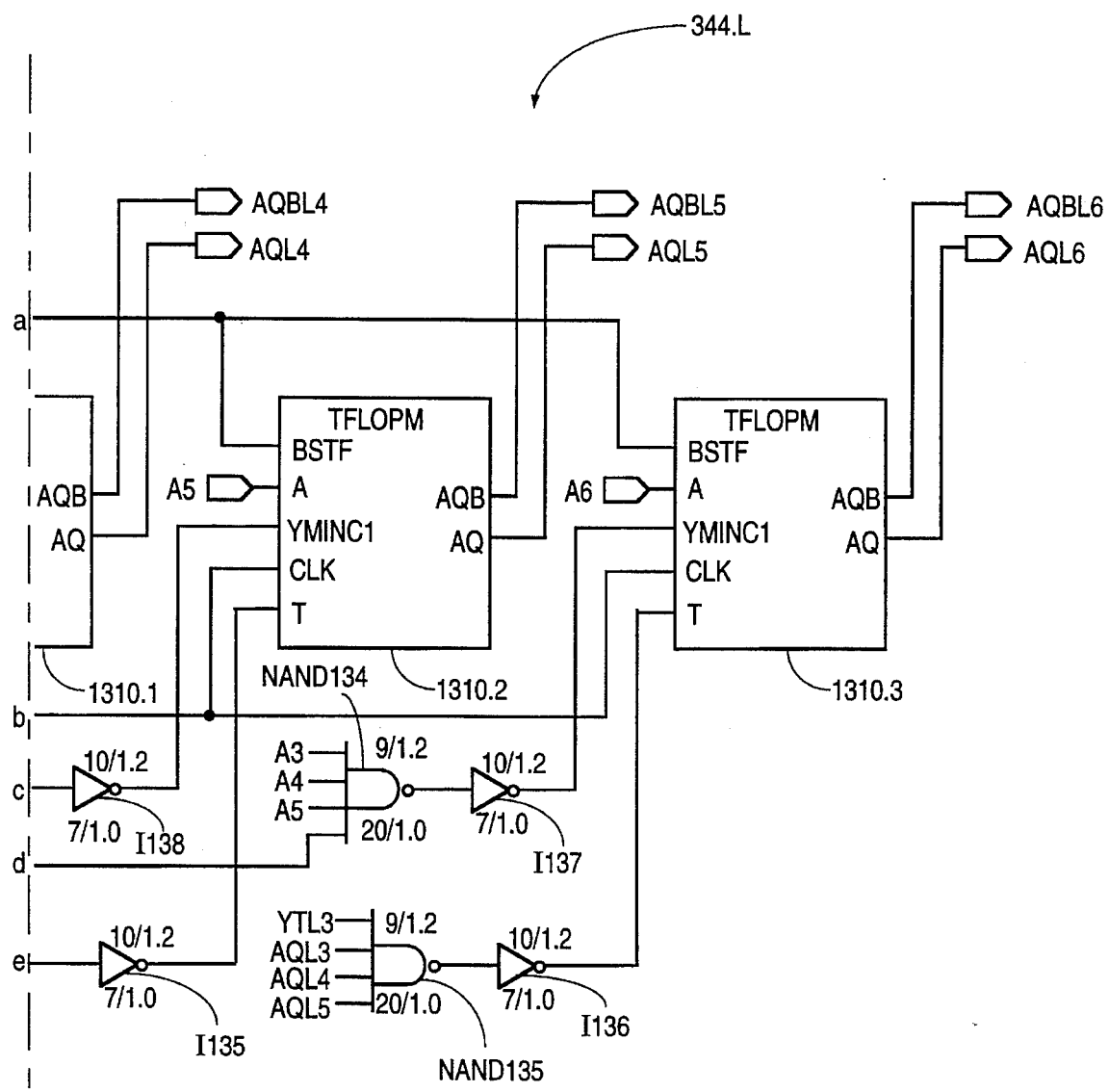
Fig. 13B
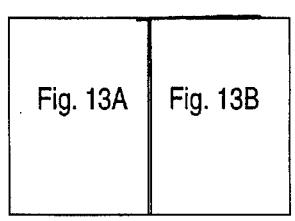

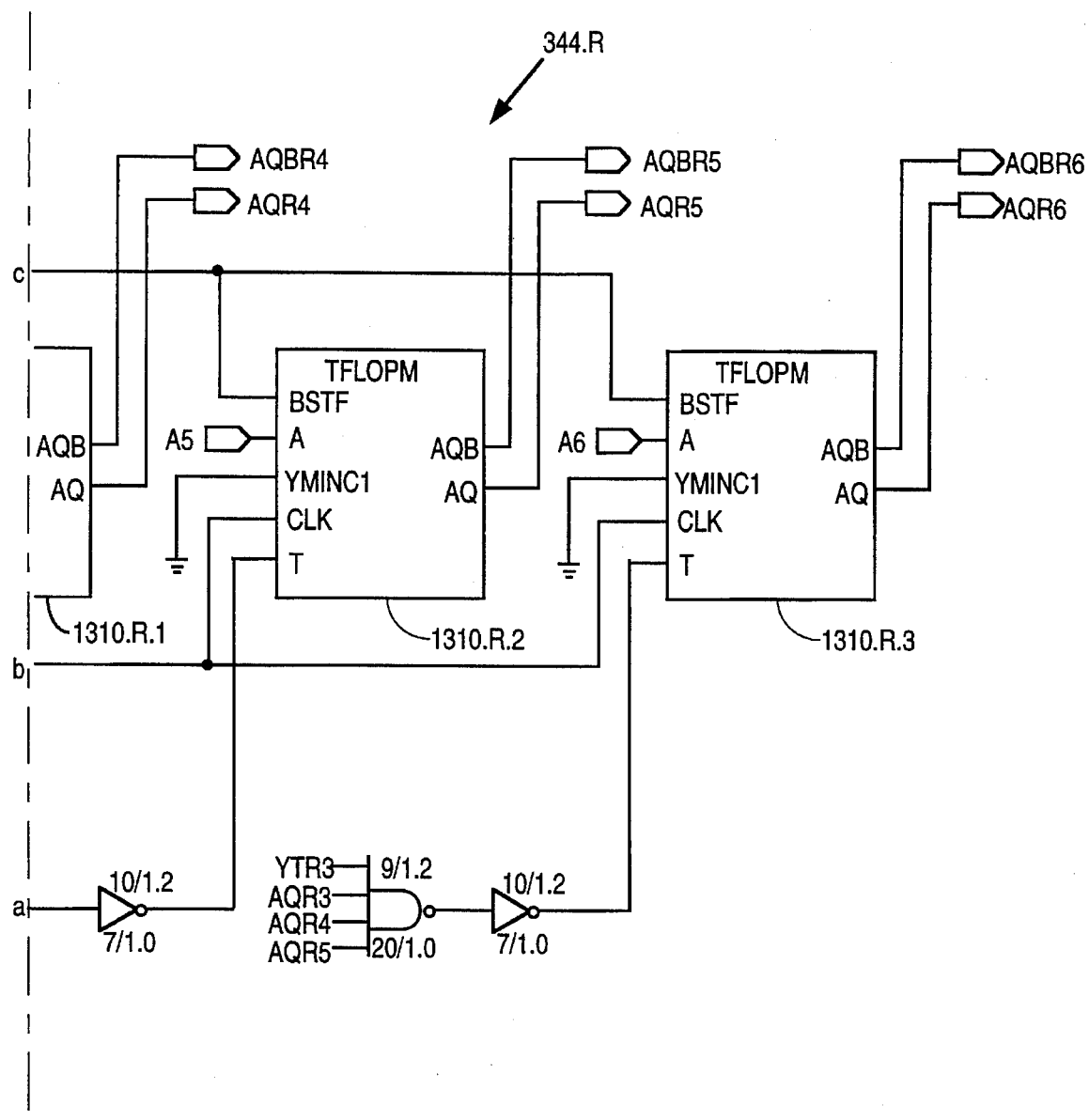
Fig. 15B
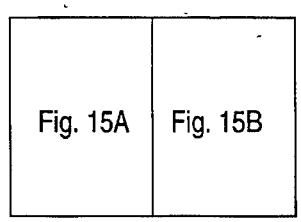

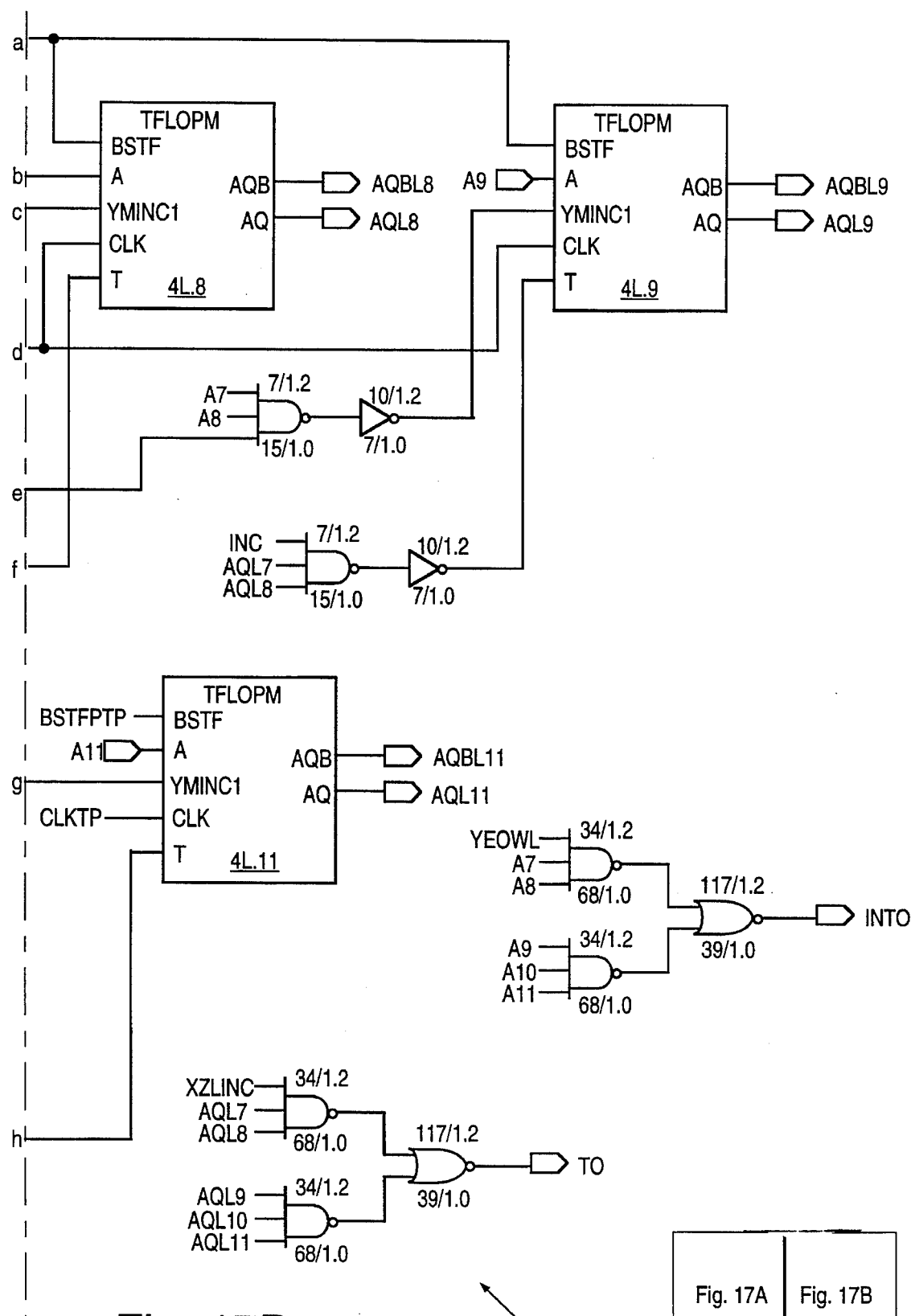
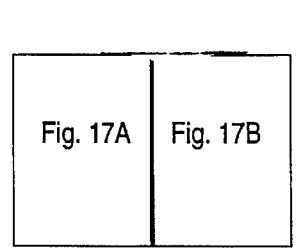
Fig. 17B

MEMORIES WITH BURST MODE ACCESS

This application is a continuation of application Ser. No. 07/836,667, filed Feb. 14, 1992 now abandoned.

BACKGROUND OF THE INVENTION

The present invention relates to memory devices, and more particularly to memories having a burst mode access.

FIG. 1 shows a memory 110 having an array of 1-bit memory locations (or "cells") M-0 through M-15. Each location M-i has unique address i. Consecutive memory locations M-0 through M-7 are arranged consecutively in the first row of the array, and are connected to word line WL-0. Consecutive locations M-8 through M-15 are arranged consecutively in the second row and are connected to word line WL-1. The memory cells of each column are connected to one of the eight bit lines BL-0 through BL-7.

In order to read location M-i, the address i is provided to address inputs 112 connected to X-decoder (row decoder) 114 and Y-decoder (column decoder) 116. X-decoder 114 decodes the address and activates the corresponding word line WL-0 or WL-1. All the memory cells connected to the activated word line provide their states on the corresponding bit lines BL-0 through BL-7. Y-decoder 116 decodes the address i and signals Y-select circuit 118 to select the column (that is, the bit line) connected to the memory location M-i. Y-select circuit 118 connects the selected bit line to sense amplifier circuit 120 which suitably amplifies the bit line signal. The amplified signal is latched into register 130 from which the signal is read to output buffer 134. Output buffer 134 converts the signal to specified levels as required by external memory reading devices (which are not shown), and provides the signal to the external devices on output DOUT.

When a memory is read sequentially (that is, consecutive reads access memory locations at consecutive addresses), the memory access can be made faster by reading from the array several consecutive locations simultaneously. Such a "burst mode" access is provided by memory 202 of FIG. 2. In memory 202, Y-select circuit 210 selects four consecutive bit lines BL-0 through BL-3 or BL-4 through BL-7 to latch contents of four consecutive locations simultaneously into register circuit 220. Register circuit 220 contains four registers 220.0 through 220.3, one for each selected bit line. Registers 220.0 through 220.3 are read one by one, through register select circuit 224, by output buffer 134. Since only one address decoding operation and only one memory array access are performed to read four consecutive memory locations, the memory reads are speeded up.

It is desirable to provide a still faster sequential reading so as to enable the memory to keep up with high speed processors and other high speed memory reading devices.

SUMMARY OF THE INVENTION

The present invention provides, in some embodiments, boundaryless burst mode access in which the burst mode read can start at any location and can continue for any number of locations. In such a memory, any number of locations, not only groups of four locations, can be read consecutively in burst mode. Sequential memory access is consequently quite fast.

In some embodiments, the boundaryless burst mode access is provided as follows. The memory array is divided into two subarrays. Each subarray includes half of the columns of the memory array. Each subarray has its own row and column decoders which can access the corresponding subarray independently from each other. The columns of each subarray are divided into a predetermined number of groups of columns (say, m groups). A sense amplifier circuit is provided for each group in both subarrays. The memory columns are numbered logically as follows. The first columns of each groups are numbered consecutively from 0 to $2m-1$. The second columns are numbered from $2m$ to $4m-1$, and so on. The column number of each column is also the address of the memory location in the first row in that column. The memory location in each column in a subsequent row has the address equal to the address of the preceding memory location in that column plus the number of memory locations per row.

In burst mode, the Y-decoder of each array selects all the first columns from each group, or all the second columns of each group, or all the third columns, and so on. The contents of the memory locations in the selected row and the selected columns are transferred to the sense amplifiers corresponding to the respective groups. Since the memory locations in each row in all the first columns have consecutive addresses, and the locations in all the second columns have consecutive addresses and so on, whichever column positions are selected by the Y-decoders the sense amplifiers receive the contents of memory locations at consecutive addresses. Then the contents of the sense amplifiers of the left subarray are transferred one by one to the memory output. Then the contents of the sense amplifiers of the right subarray are transferred one by one to the output. At the same time, in the left subarray, the next consecutive memory locations have their contents transferred to the sense amplifiers. Then the contents of the sense amplifiers of the left subarray are transferred one by one to the memory output. At the same time, the next consecutive memory locations are selected in the right subarray and their contents are transferred to the sense amplifiers. Such read can continue indefinitely.

In some embodiments, each sense amplifier is enabled only while its output is transferred to the memory output. In other embodiments, several sense amplifiers whose outputs are to be transferred immediately after the output of the current sense amplifier, are also enabled. The other sense amplifiers are disabled providing power saving.

This summary does not describe all the features of the invention. The invention is defined by the appended claims.

BRIEF DESCRIPTION OF THE DRAWINGS

FIGS. 8A, 8B diagram a memory according to the present invention.

FIG. 9 is a table illustrating the position and the logical numbering of the columns in the memory of FIGS. 8A, 8B.

FIGS. 13A, 13B diagram a Y-register of the memory of FIGS. 8A, 8B.

FIGS. 15A, 15B diagram a Y-register of the memory of FIGS. 8A, 8B.

FIGS. 17A, 17B diagram a portion of the X-register of FIG. 16.

DESCRIPTION OF THE PREFERRED EMBODIMENT

Figure 1:
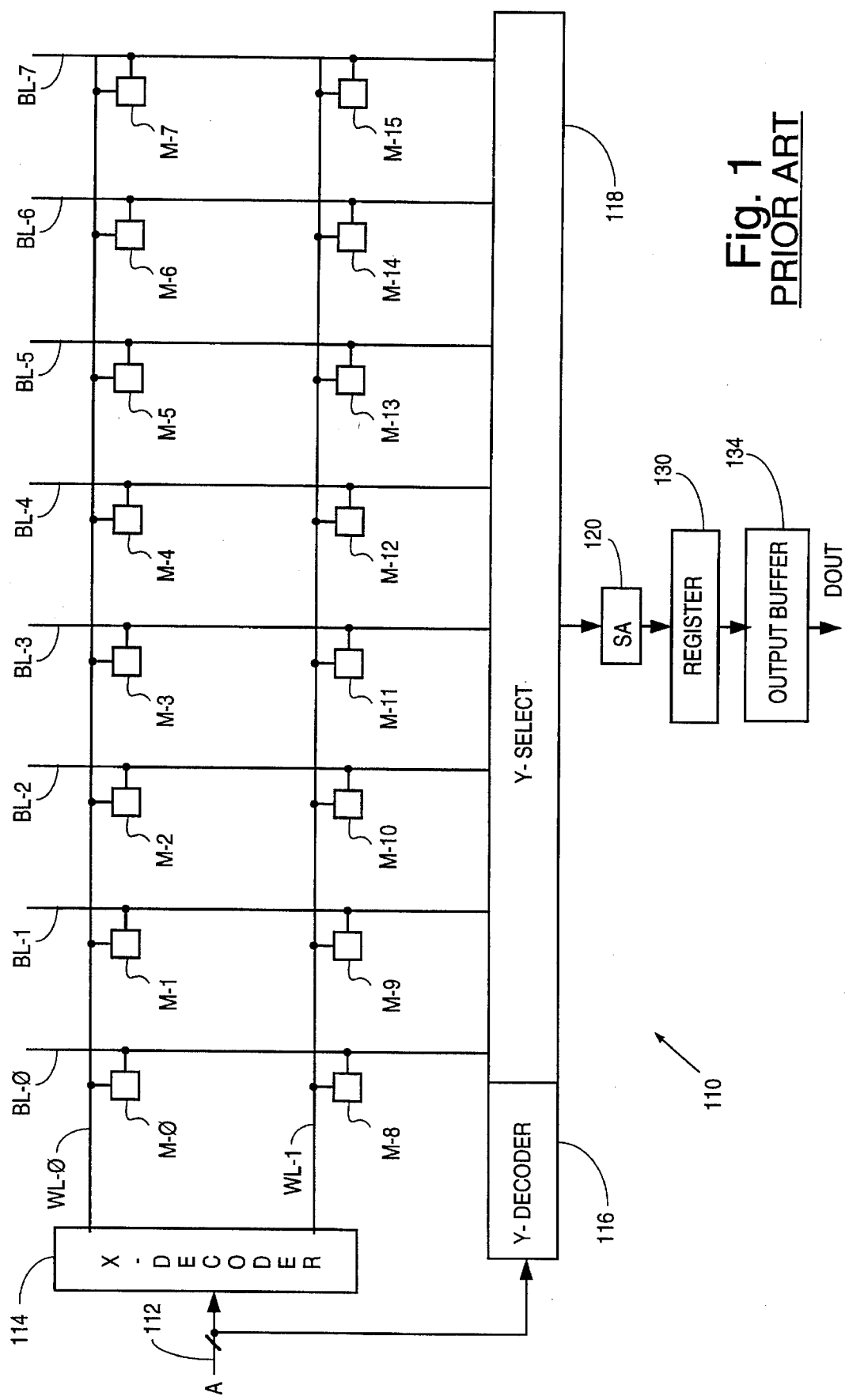
FIGS. 1 and 2 show prior art memories.
Figure 2:
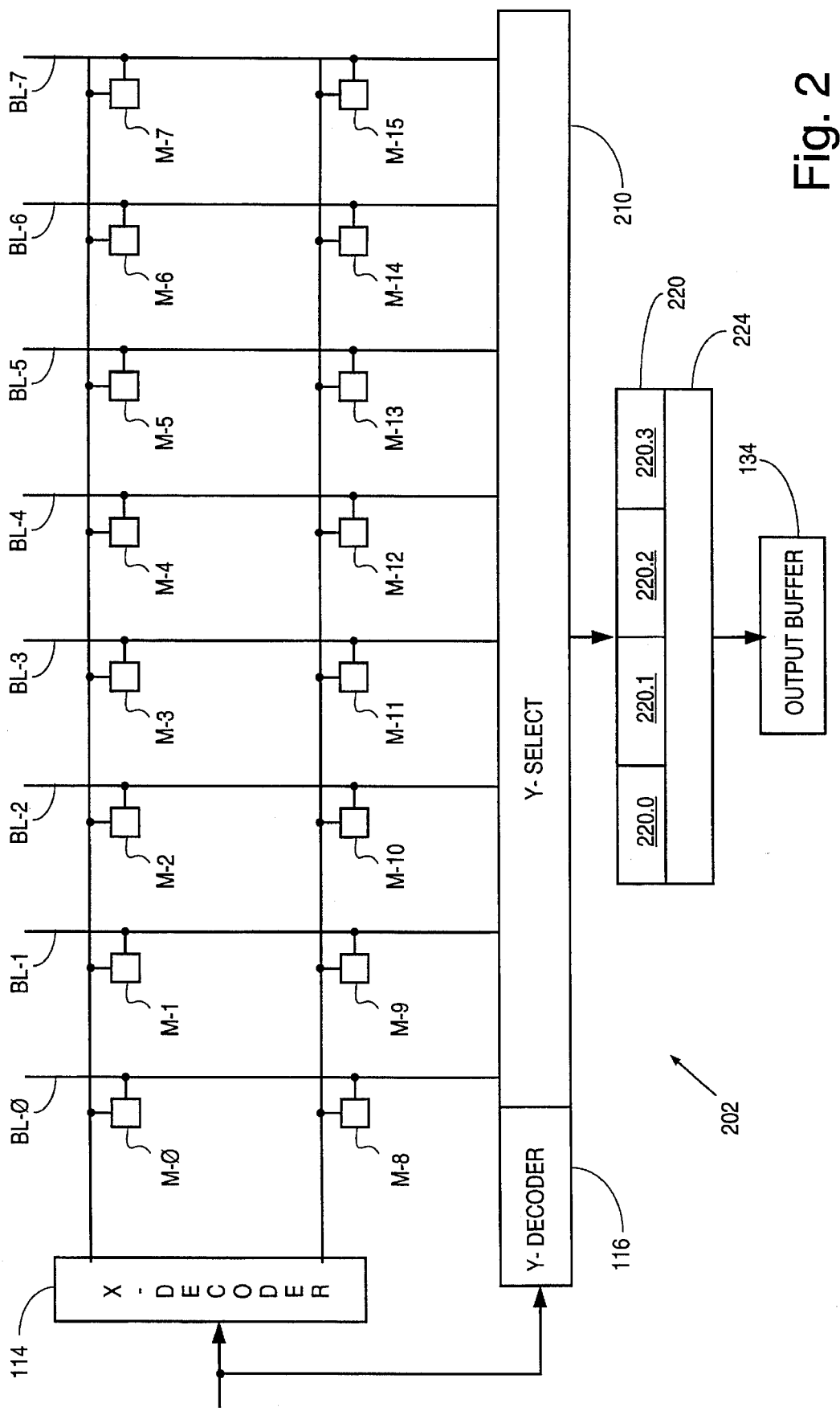
Figure 3A:
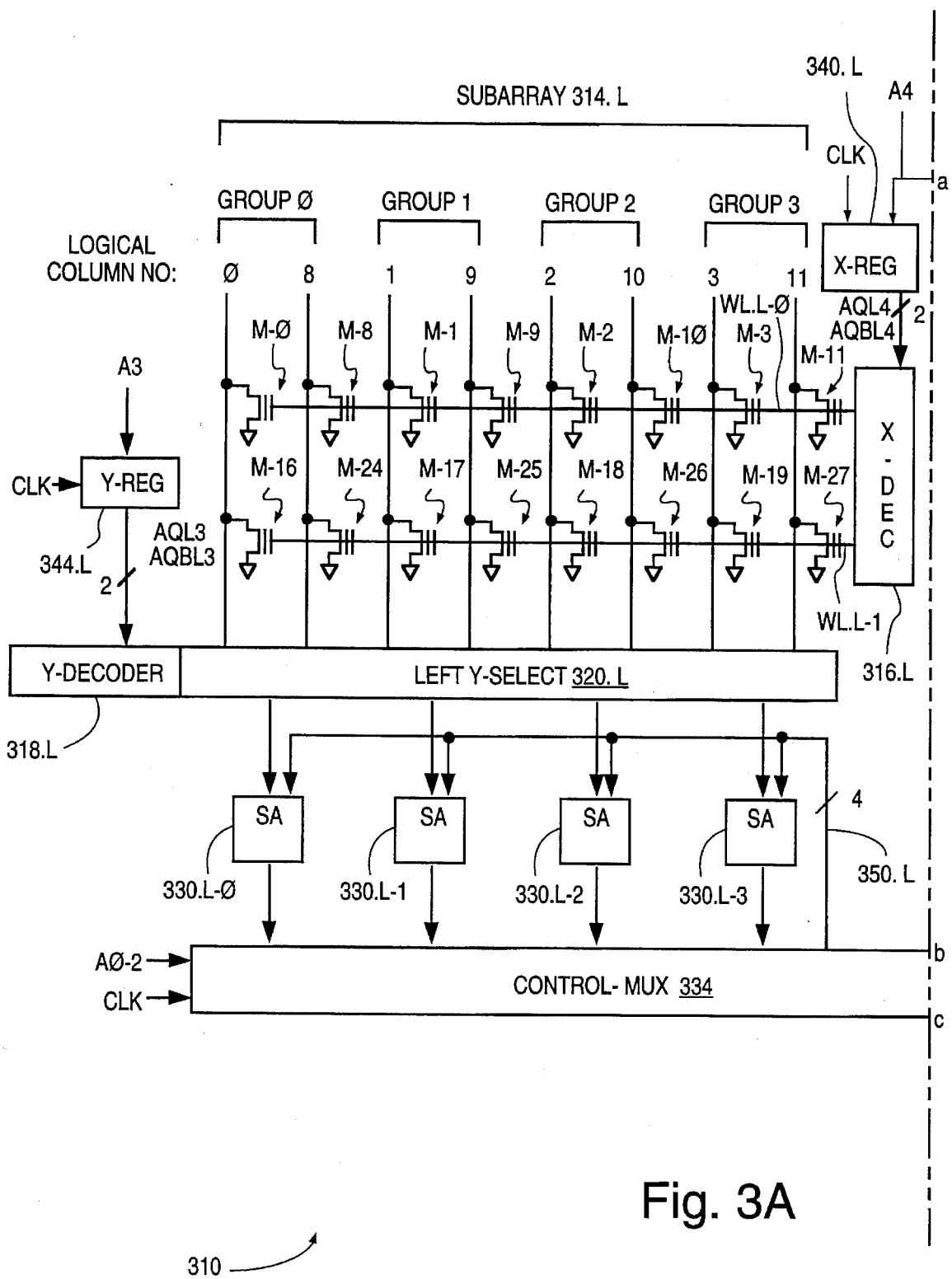
FIGS. 3A, 3B diagram a memory according to the present invention.
Figure 3B:
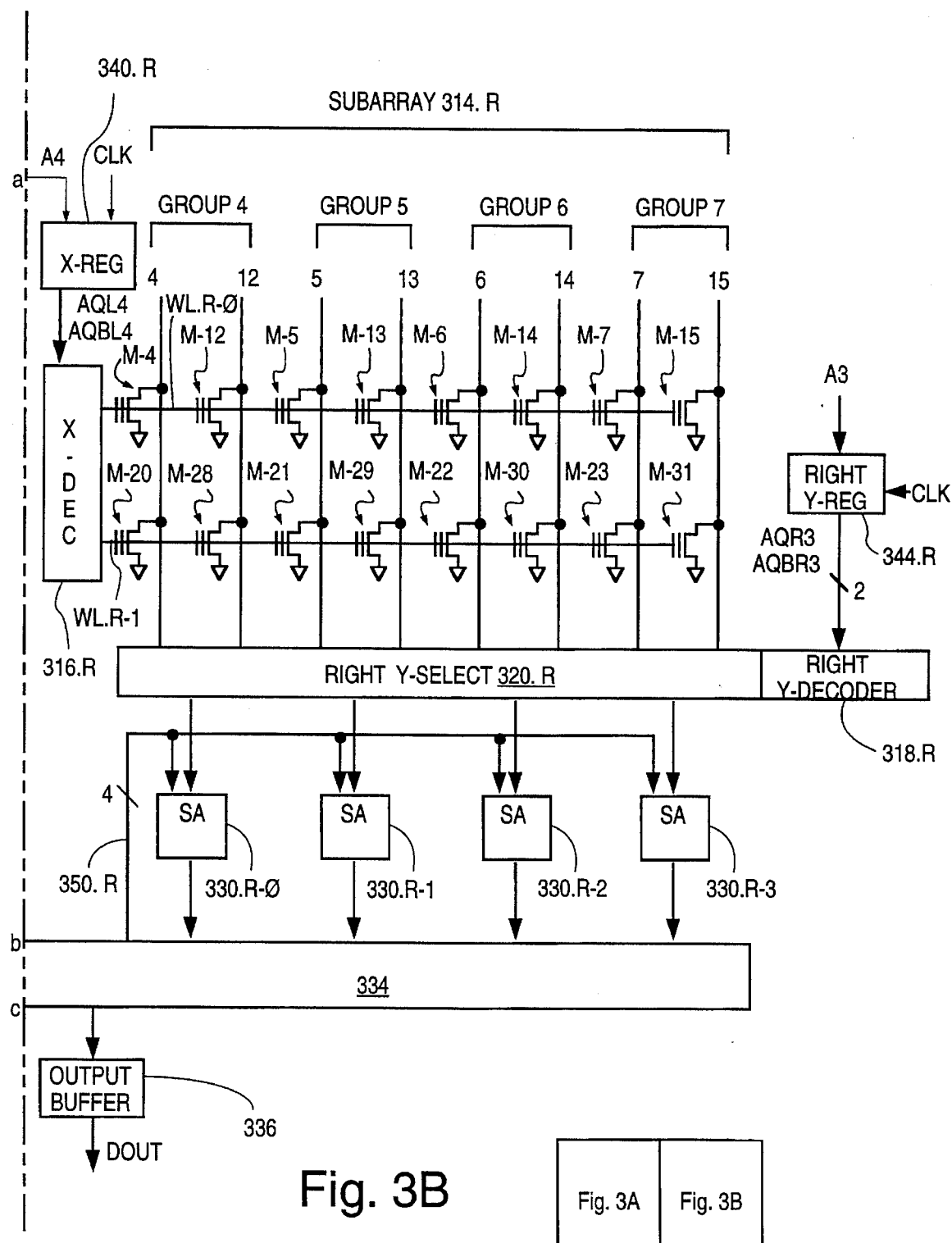

FIG. 3 shows a memory 310 that provides a boundaryless burst mode access so as to allow reading in burst mode any number of memory locations starting at any address. Memory 310 has 32 memory locations M-0 through M-31 arranged in an array of two rows and 16 columns. The array is divided in two subarrays of eight columns each: left subarray 314.L and right subarray 314.R. Subarrays 314.L and 314.R can be read independently from each other. Each subarray has its own X- and Y-decoders and Y-select circuit. Subarray 314.L has X-decoder 316.L, Y-decoder 318.L, and Y-select circuit 320.L. Subarray 314.R has X-decoder 316.R, Y-decoder 318.R, and Y-select circuit 320.R. The eight columns of subarray 314.L are divided into four groups 0 through 3. Each group has two adjacent columns. Similarly, the eight columns of right subarray 314.R are divided in four groups 4 through 7 of adjacent columns.

Each memory location M-i has address i. Memory locations M-i are arranged along each row non-consecutively as follows. In the first row consecutive memory locations M-0 through M-7 are placed in respective first columns of the respective groups 0 through 7. Consecutive memory locations M-8 through M-15 are placed in the respective second columns of groups 0 through 7. In the second row, consecutive memory locations M-16 through M-23 are placed in the first columns of the respective groups 0 through 7. Consecutive memory locations M-24 through M-31 are placed in the second columns of the respective groups 0 through 7.

Memory 310 can be read in either burst mode or random (non-burst) mode. In either mode Y-select circuit 320.L selects simultaneously one column from each group 0 through 3 and provides the selected column signals to the respective sense amplifier circuits 330.L-0 through 330.L-3. Y-select circuit 320.L selects either the first columns from each group 0 through 3 or the second columns from each group. Hence if X-decoder 316.L selects the first row word line WL.L-0 in subarray 314.L, sense amplifier circuits 330.L-0 through 330.L-3 read, respectively, consecutive memory locations M-0 through M-3 (if Y-select circuit 320.L selects the first columns) or memory locations M-8 through M-11. If X-decoder 316.L selects the second row word line WL.L-1, sense amplifiers 330.L-0 through 330.L-3 read, respectively, consecutive locations M-16 through M-19 or M-24 through M-27.

Similarly, Y-select circuit 320.R selects either all the first columns or all the second columns of groups 4 through 7. Sense amplifier circuits 330.R-0 through 330.R-3 read four respective consecutive memory locations in the selected columns in the row selected by X-decoder 316.R.

Control-multiplexer circuit 334 selects one of the eight sense amplifier circuits 330.L-0 through 330.L-3, 330R-0 through 330.R-3 and provides the output signal from the selected sense amplifier circuit to output buffer 336 which in turn provides the signal to output DOUT for external reading devices.

Figure 4:
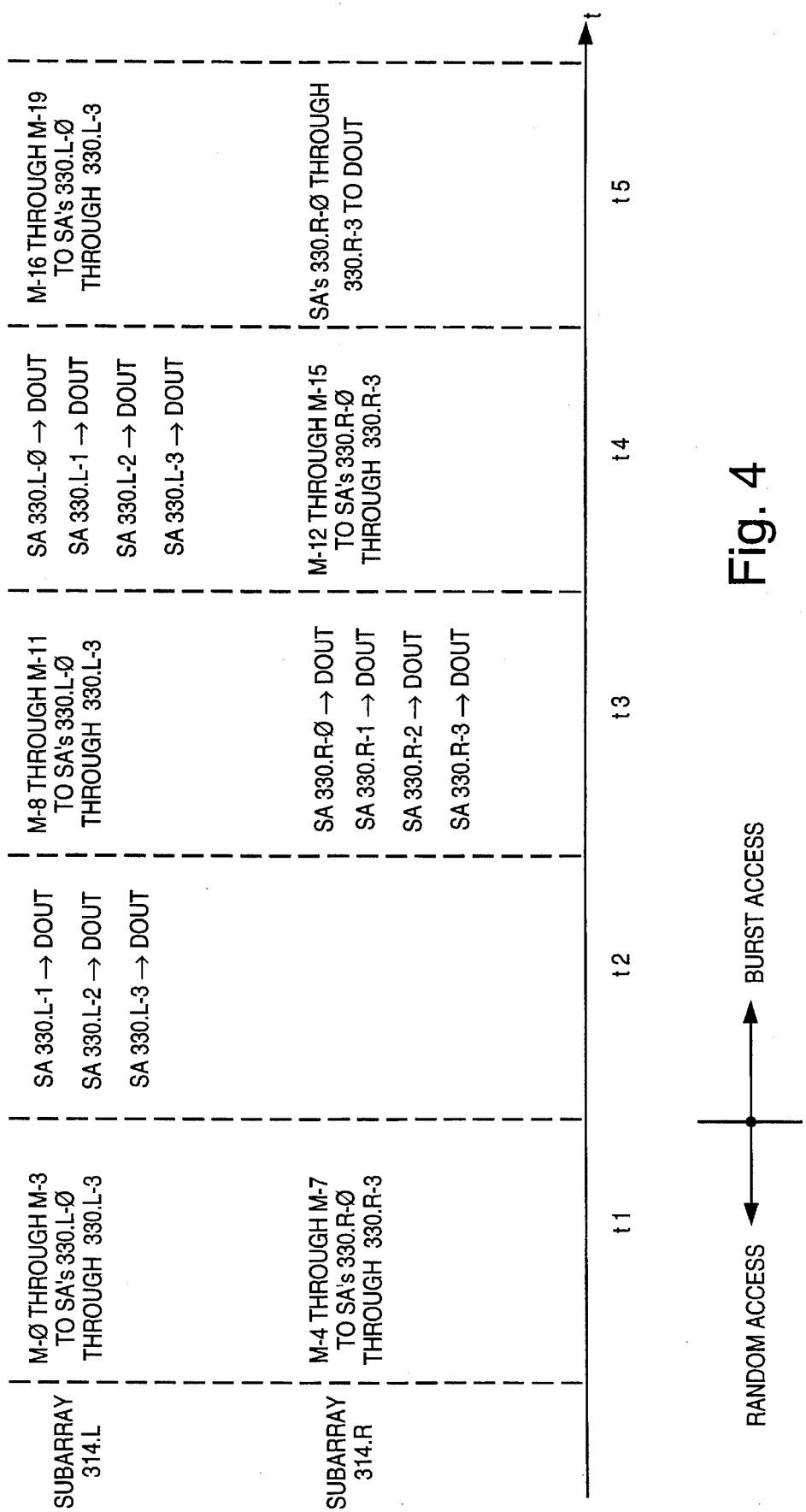
FIG. 4 is a timing diagram for the memory of FIGS. 3A, 3B.

FIG. 4 shows a timing diagram illustrating the operation of memory 310. In FIG. 4, it is assumed that during time period t1 memory 310 is in random mode, and address lines A0–A4 identify location M-1 (address "1"). At the end of period t1, memory 310 is put into burst mode by asserting a signal BSTFBT (not shown). Thus during period t1, A4=A3=A2=A1=0, and the least significant bit A0=1. Address bit A4 identifying the first row of memory 310 is supplied to X-registers 340.L and 340.L. X-register 340.R generates signal AQL4=0 and its complement AQBL4=1 to select the first row in subarray 314.L. Similarly, X-register 340.R generates signal AQR4=0 and its complement AQBR4=1 to select the first row in subarray 314.R.

In FIG. 4, during the random mode period t1, X-decoder 316.L activates word line WL.L-0 of the first row in subarray 314.L, and X-decoder 316.R activates word line WL.R-0 of the first row in subarray 314.R.

Input address bit A3=0 is supplied to Y-register 344.L which generates signal AQL3=0 and its complement AQBL3=1 to Y-decoder 318.L to select the first columns of groups 0 through 3. Y-decoder 318.L causes Y-select circuit 320.L to select the first columns of groups 0 through 3. Consequently sense amplifier circuits 330.L-0 through 330.L-3 read respective consecutive locations M-0 through M-3.

Similarly, address bit A3 is supplied to Y-register 344.R which generates signal AQR3=0 and its complement AQBR3=1 to Y-decoder 318.R to select the first columns of groups 4 through 7. Consequently, sense amplifier circuits 330.R-0 through 330.R-3 read respective locations M-4 through M-7 from the first columns of groups 4 through 7.

Starting with period t2, memory 310 is operated in burst mode. The CLK signal is used to clock out data of consecutive memory locations to output DOUT. Control-multiplexer circuit 334 selects the output of sense amplifier circuit 330.L-1 so as to transfer the contents of location M-1 to output buffer 336. From this time on, A0–A2 are not used as address bits. On the next rising edge of clock CLK, control-multiplexer circuit 334 selects sense amplifier circuit 330.L-2 to transfer contents of location M-2 to output buffer 336.

On the next rising edge of CLK, control-multiplexer circuit 334 selects sense amplifier circuit 330.L-3 to transfer data from location M-3 to output buffer 336.

During period t3, in subarray 314.R, control-multiplexer circuit 334 selects sense amplifier circuits 330.R-0 through 330.R-3 in sequence to provide the contents of locations M-4 through M-7 to output buffer 336. At the same time, in subarray 314.L, Y-register 334.L generates, in response to the clock signal CLK, signals AQL3=1, AQBL3=0 to select the second columns of groups 0 through 3. (Address bits A1–A4 are ignored.) Sense amplifier circuits 330.L-0 through 330.L-3 read simultaneously respective consecutive locations M-8 through M-11.

During period t4, in subarray 314.L, sense amplifier circuits 330.L-0 through 330.L-3 transfer in sequence to output buffer 336 the contents of respective locations M-8 through M-11. At the same time, in subarray 314.R, consecutive locations M-12 through M-15 are transferred from the second columns of groups 4 through 7 to respective sense amplifier circuits 330.R-0 through 330.R-3.

During period t5, in subarray 314.L, X-register 340.L (which responds to clock signal CLK) selects the second row word line WL.L-1. Y-register 344.L selects the first columns of groups 0–4, and memory locations M-16 through M-19 are read into respective sense amplifier circuits 330.L-0 through 330.L-3.

At the same time, sense amplifier circuits 330.R-0 through 330.R-3 transfer in sequence the contents of locations M-12 through M-15 to output buffer 336.

The burst mode operation can continue indefinitely and can be stopped at any point on the read of any sense amplifier circuit. In some embodiments, the burst mode read can wrap around so that after reading the last location M-31, locations starting with M-0 can be read in sequence. Thus memory 310 allows boundaryless burst mode access in which any number of consecutive locations, starting with any location, can be read in one burst mode operation.

Control-multiplexer circuit 334 of memory 310 provides enable signals to sense amplifier circuits 330.L-0 through 330.L-3 and 330.R-0 through 330.R-3 on busses 350.L and 350.R to enable only the sense amplifier circuit being read and thus to reduce power consumption. In some embodiments, control-multiplexer circuit 334 enables, in addition to the sense amplifier circuit being read, a certain number of sense amplifier circuits to be read immediately after, so as to allow those sense amplifier circuits sufficient time to develop their output signals. For example, in one embodiment, control-multiplexer circuit 334 enables four sense amplifier circuits starting with the sense amplifier circuit being read. For example, when sense amplifier circuit 330.R-2 is being read, control-multiplexer circuit 334 enables sense amplifier circuits 330.R-2, 330.R-3, 330.L-0 and 330.L-1. The other four sense amplifier circuits are disabled. Since sense amplifier circuits have a large power consumption (in some embodiments, 50% of the entire power consumed by the memory), disabling some sense amplifier circuits during burst mode access provides significant power saving. Alternatively, the power consumption in each sense amplifier can be increased to provide higher speed at the expense of smaller or no power saving.

The burst mode access scheme of FIG. 3 can be used in any type of memory including any kind of ROM or RAM. In some embodiments, each memory cell M-i is connected to two bit lines—a direct bit line and a complementary bit line. See, for example, the six transistor cell described in C. A. Holt, *Electronic Circuits,* (John Wiley & Sons, 1978) incorporated by reference herein, page 293. In such embodiments, each column in the memory array includes a direct bit line and a complementary bit line.

Figure 5:
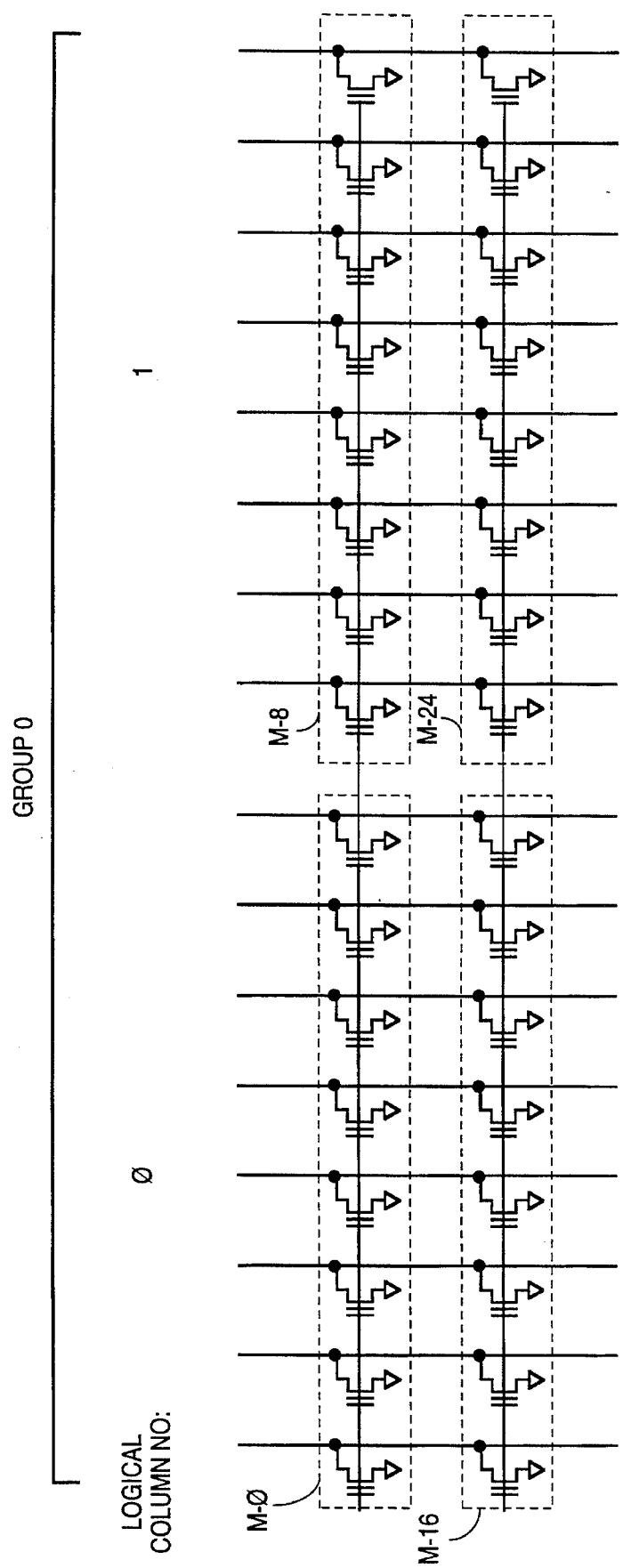
FIG. 5 is a circuit diagram of memory cells of a memory according to the present invention.

In some embodiments, each memory location M-i includes several memory cells, for example, eight cells as in FIG. 5. Each column in FIG. 5 includes eight bit lines, and each sense amplifier circuit 330.L-i, 330.R-i is replaced by eight sense amplifiers, one for each bit line. Output buffer 336 provides one byte (8 bits) of data on eight-bit output DOUT.

Memory 310 can be of any size. In various embodiments, each subarray can have any number m of sense amplifiers. (In memory 310, m=4.) Each subarray is divided into m groups of columns. Each group contains C/2m columns, where C is the total number of columns in the array (C=16 in FIG. 3). The first columns in each group are assigned consecutive logical numbers from 0 to 2m−1, the second columns are assigned consecutive logical numbers from 2m to 4m−1, and so on. The logical column numbers are also the addresses of the respective memory cells of the first row. The memory cells of the second row have the address equal to the logical column number plus the number of the memory cells per row (plus 16 in FIG. 3). The memory cells of the second row have the address equal to the address of the memory cell of the first row in the same column increased by the number of memory cells per row, and so on for the third, fourth and other rows if present.

Figure 6:
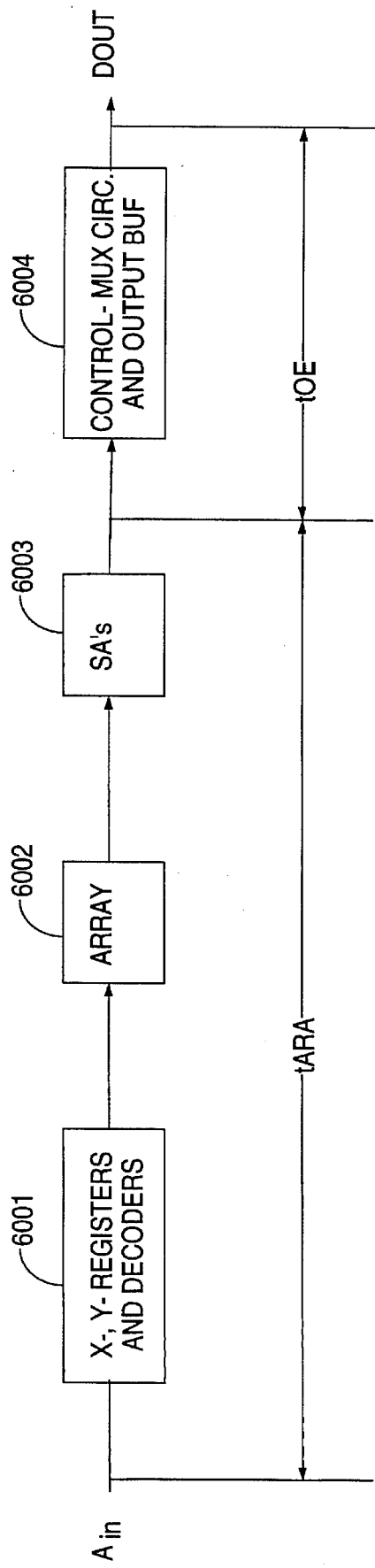
FIG. 6 shows a timing scheme for the memory of FIGS. 3A, 3B.

FIG. 6 shows a timing scheme for the memory of FIG. 3. The first data output is provided on output DOUT after time tARA+tOE. tARA is measured from the time that address inputs A0–A4 are made available to X-registers 340.L and 340.R and Y-registers 344.L and 344.R, to the time when sense amplifier circuits 330.L-0 through 330.L-3 and 330.R-0 through 330.R-3 develop their output signals. Time tOE is the time to transfer a sense amplifier output to output DOUT through output buffer 336. The number m of sense amplifier circuits is chosen in some embodiments so that each subsequent datum would be read out within time tOE. Namely, m is chosen so that tARA$\leq$m*tOE, so that the time to read sense amplifier circuits from one subarray (tARA) would be not greater than the total time m*tOE to read out from sense amplifier circuits of the other subarray through output buffer 336. Thus m$\geq$tARA/tOE. For decoding convenience, m is chosen in some embodiments to be also a power of 2.

Figure 7:
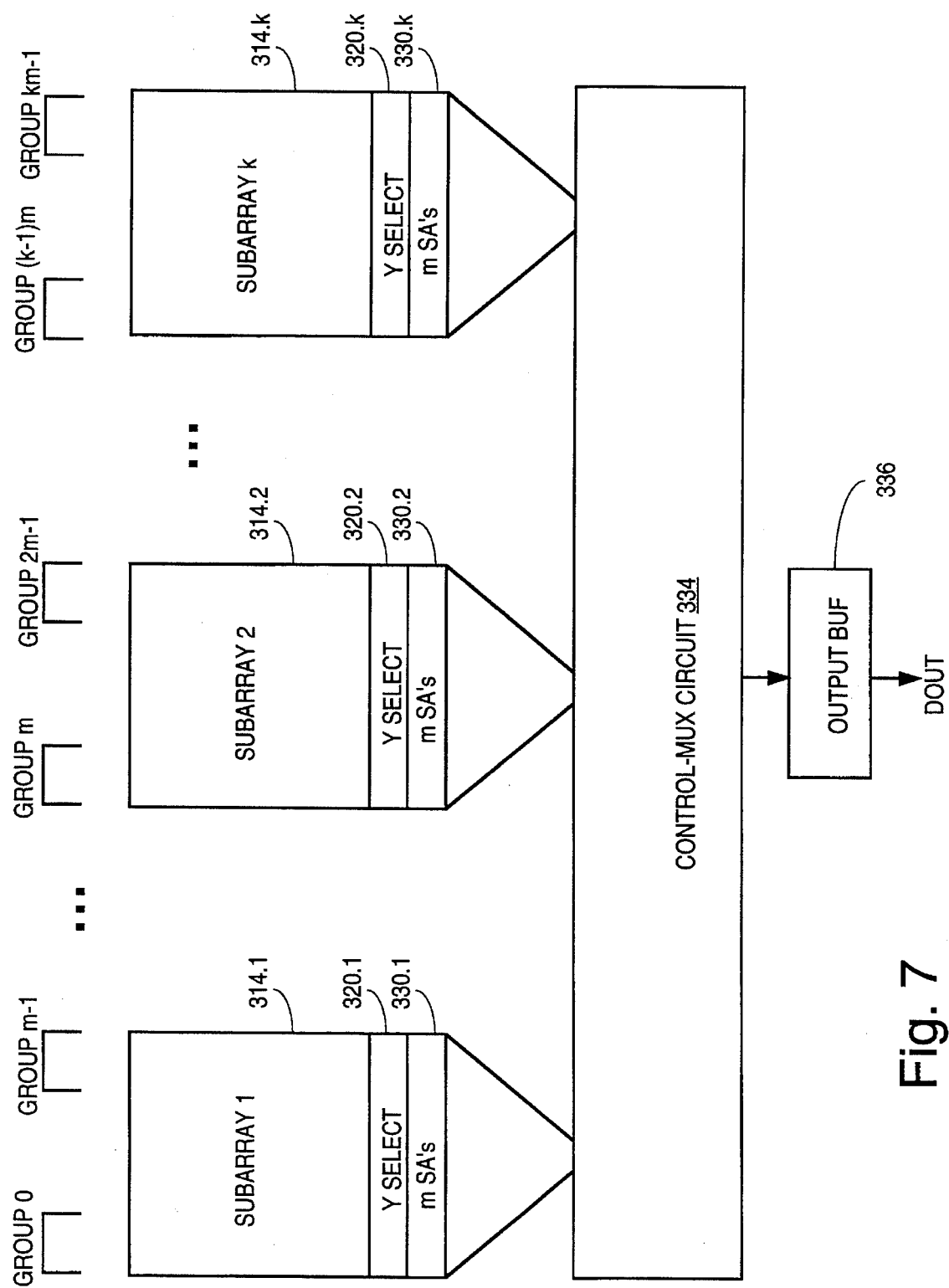
FIG. 7 is a block diagram of a memory according to the present invention.

In some embodiments, the memory array is subdivided into more than two subarrays. In FIG. 7, the memory array is subdivided into k subarrays. Each subarray is provided with its own X- and Y- decoders. The columns in each subarray are subdivided into m groups, and one sense amplifier circuit is provided for each group. Control-multiplexer circuit 334 selects one sense amplifier circuit to provide its output to output buffer 336. In the memory of FIG. 7, while the outputs of the sense amplifier circuits from k−1 subarrays are provided to output buffer 336, the sense amplifier circuits in the remaining subarray develop output signals corresponding to the subarray data. Hence, to read each datum, starting from the second datum, in time tOE, the following relationship must hold:

$$tARA \leq m * (k-1) * (tOE)$$

Hence, the number of sense amplifiers mk≧(tARA/tOE) * k/(k−1). As k increases, fewer sense amplifiers are needed since the right hand side of the inequality decreases as k increases.

Figure 8A:
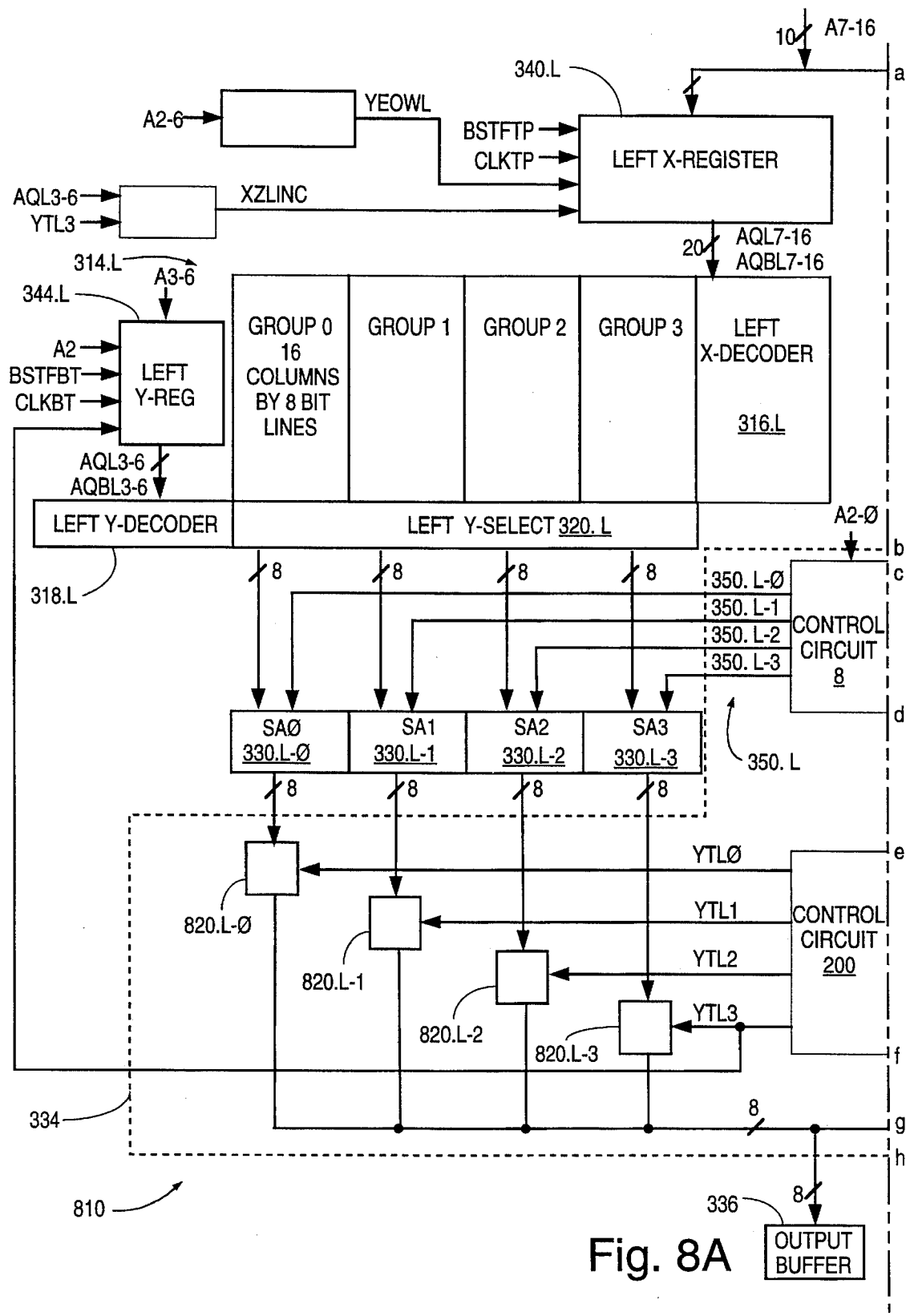

FIGS. 8–28 illustrate another memory providing boundaryless burst mode access. Memory 810 of FIG. 8 is one megabit EPROM having $2^{17}$ 8-bit memory locations. Each bit is a floating gate transistor such as shown in FIG. 3. Memory 810 is fabricated in an integrated circuit in some embodiments. The memory array has 128 columns and 1,024 rows. Each column has eight bit lines. The memory array is divided into two subarrays 314.L and 314.R of 64 columns each. Each subarray is divided into four groups of 16 columns each.

FIG. 9 illustrates the position and the logical numbering of the columns in memory 810. The physical column number represents the physical position of the column in the integrated circuit. The columns are laid out in parallel consecutively starting with column physical number 0 through 127. The logical column number is the address of the corresponding memory location in the first row of the array. The first columns of each group have consecutive logical numbers 0–7. See the first columns of the tables of FIG. 9. The second columns of each group have consecutive logical numbers 8 through 15, the third columns have logical numbers 16 through 23, and so on.

Each sense amplifier circuit 330.L-0 through 330.L-3 reads one column from the respective group 0 through 3. One sense amplifier circuit 330.R-0 through 330.R-3 reads one column from the respective group 4 through 7. Each sense amplifier circuit contains eight sense amplifiers, one for each bit line of the selected column.

Control-multiplexer circuit 334 includes control circuit 8, control circuit 200, and pass transistor circuits 820.L-0 through 820.L-3 and 820.R-0 through 820.R-3 as described more fully below. Output buffer 336 reads eight bits from the selected sense amplifier circuit to eight-bit output DOUT.

X-register 340.L receives ten-bit row address A7–A16 and generates row address signals AQL7–AQL16 and complementary signals AQBL7–AQBL16 to X-decoder 316.L. X-register 340.L receives also signal BSTFTP which is asserted high to enable the burst mode. X-register 340.L receives also clock signal CLKTP which is low in non-burst mode and which clocks the register in burst mode.

X-register 340.R similarly receives the ten-bit address signal A7–A16 and generates signals AQR7–AQR16 and complementary signals AQBR7–AQBR16 to X-decoder 316.R.

Figure 10:
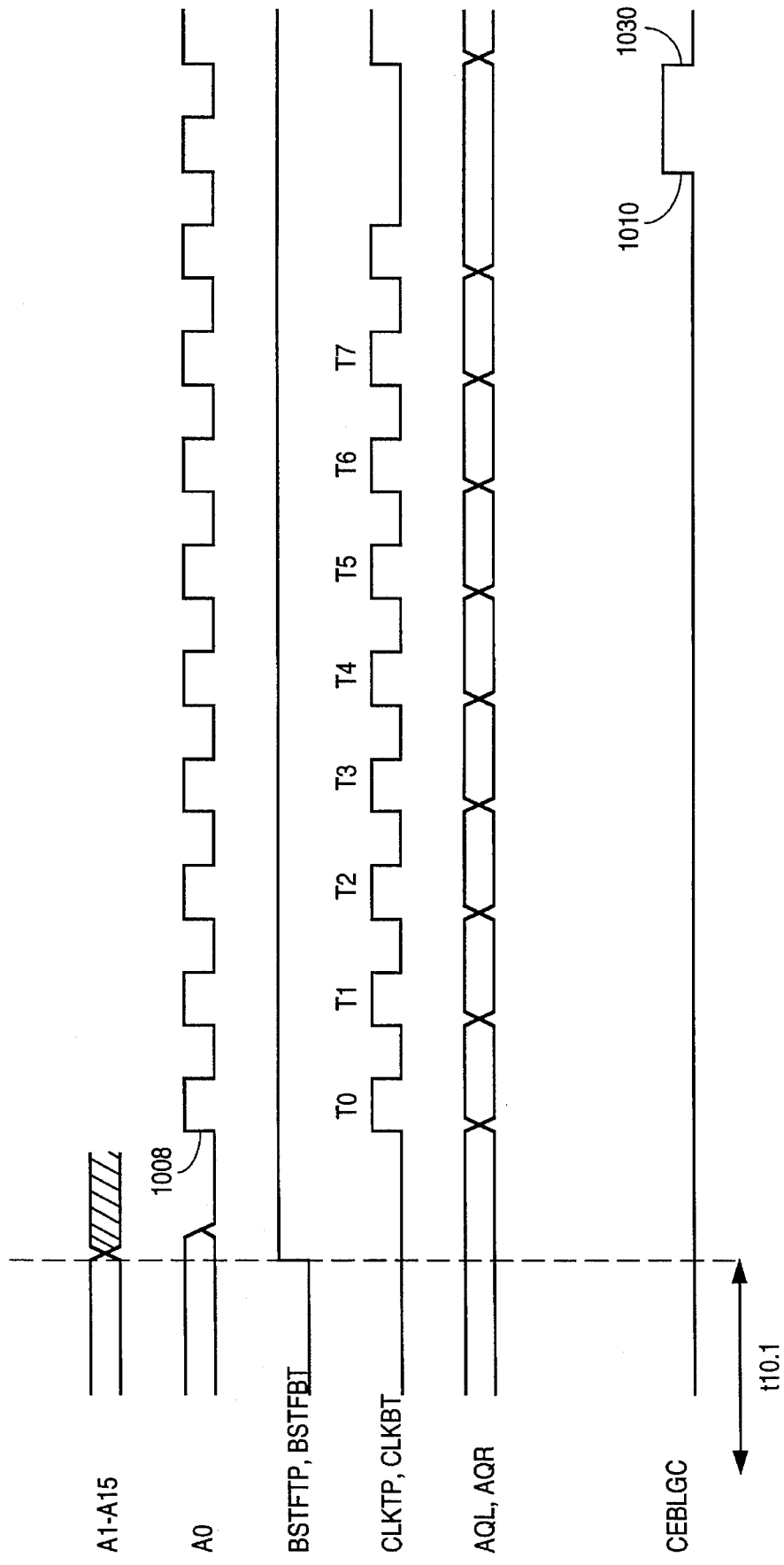
FIG. 10 is a timing diagram for the memory of FIGS. 8A, 8B.

FIG. 10 shows a timing diagram illustrating the operation of memory 810. Initially, during time period t10.1, BSTFTP is low, and the memory operates in non-burst mode. Signals AQL7–AQL16 and AQR7–AQR16 are generated from signals A7–A16 to identify a location being read in non-burst mode. Signals AQL0–AQL16 and AQR0–AQR16 are shown as AQL, AQR in FIG. 10.

At the end of period t10.1, BSTFTP is asserted high. From that point, input address lines A1–A15 are ignored, and A0 is used to generate clock signal CLKTP. The burst mode access starts on the rising edge of A0. Address signals AQL, AQR hold their value until the first rising edge of A0 (point 1008 in FIG. 10).

Y-register 344.L receives column address signals A3–A6 and generates signals AQL3–AQL6 and complementary signals AQBL3–AQBL6 to select simultaneously one column from each group 0 through 3. Y-register 344.R receives column address signals A3–A6 and generates signals AQR3–AQR6 and complementary signals AQBR3–AQBR6 to select simultaneously one column from each group 4 through 7. Y-registers 344.L and 344.R receive also signals BSTFBT and CLKBT. Signals BSTFBT and CLKBT are the same as the respective signals BSTFTP and CLKTP, but signals BSTFBT and CLKBT are provided on different lines using separate buffers (not shown) so as to speed up the memory access.

At each rising edge of A0, the output signal of a new sense amplifier 330.L-0 through 330.L-3, 330.R-0 through 330.R-3 is transferred to output DOUT. Signals A1–A15 are ignored, and signals AQL, AQR are generated on each rising edge of A0.

Figure 11:
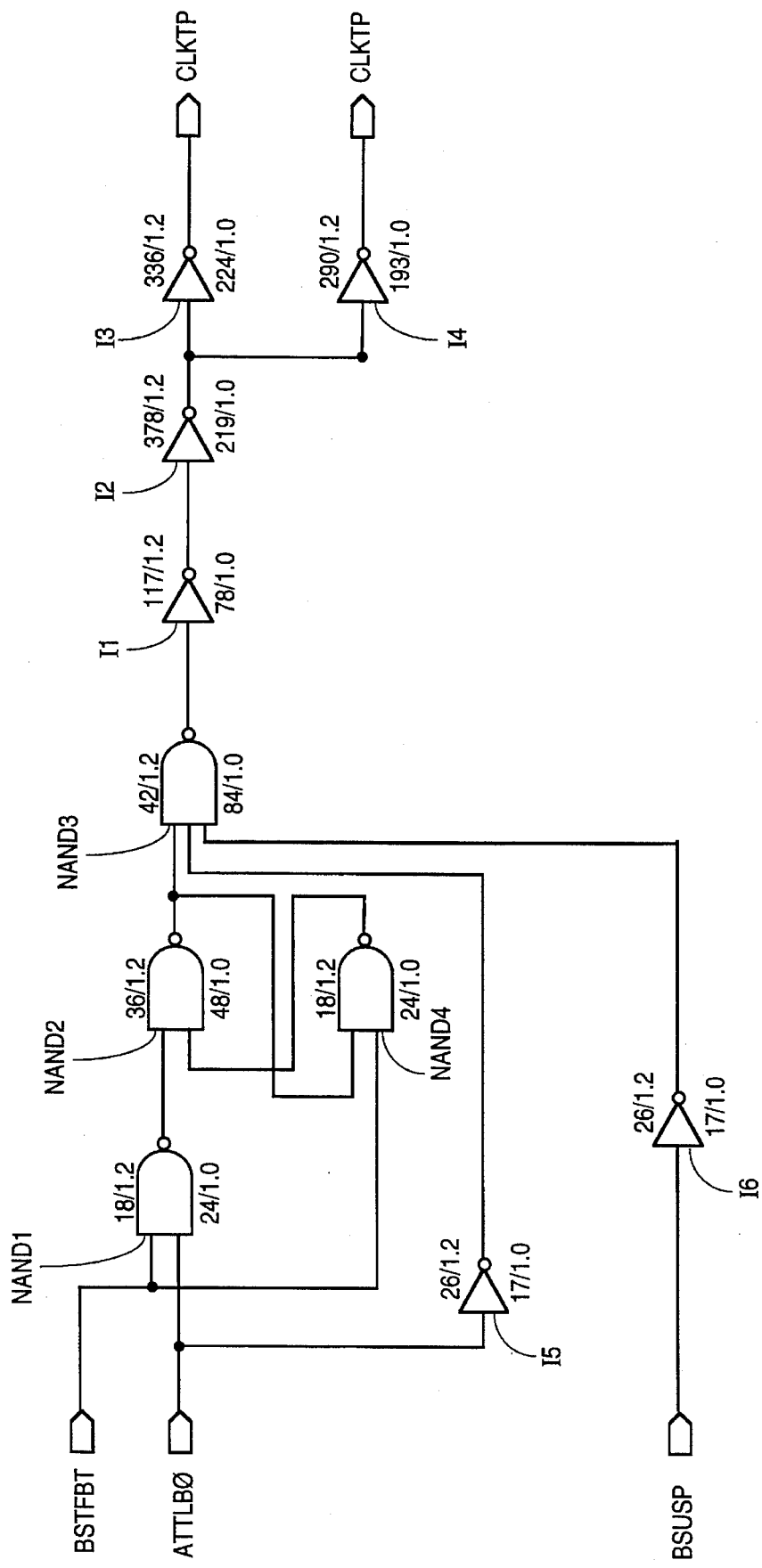
FIG. 11 diagrams a circuit that generates signals for the memory of FIGS. 8A, 8B.
Figure 12:
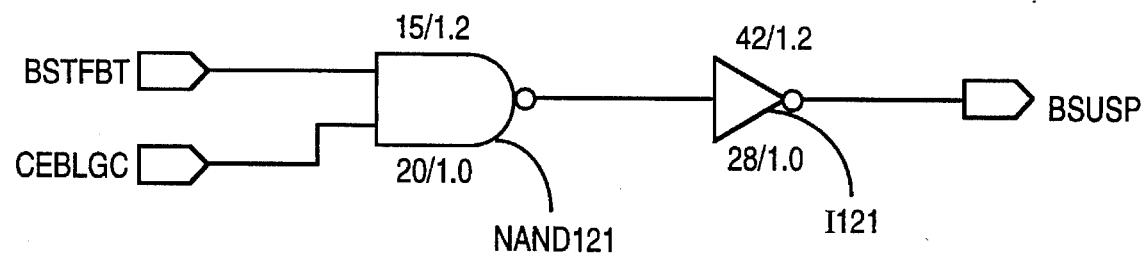
FIG. 12 diagrams a circuit that generates a signal for the circuit of FIG. 11.

FIG. 11 shows a circuit generating signals CLKTP and CLKBT from inputs BSTFBT, ATTLB0 which is a suitably buffered and inverted version of A0, and BSUSP generated by the circuit of FIG. 12. BSTFBT and ATTLB0 are NANDed by NAND gate NAND1 whose output is provided to the flip-flop formed by NAND gates NAND2 and NAND4. The output of the flip-flop is provided to NAND gate NAND3 whose other input is the complement of ATTLB0 provided by inverter I5. The output of NAND gate NAND3 is buffered by inverters I1 and I2. The output of I2 is provided through inverter I3 as signal CLKTP and through inverter I4 as CLKBT.

BSUSP is inverted by inverter I6 whose output is the third input to NAND gate NAND3. Each NAND gate in FIGS. 11–28 is a CMOS NAND gate. CMOS NAND gates are described, for example, in John F. Wakerly, *Digital Design: Principles and Practices* (Prentice-Hall, 1990), which is incorporated by reference herein, at page 126. The numbers above each NAND gate indicate the P-channel transistor dimensions of the NAND gate, and the numbers below the NAND gate indicate the N-channel transistor dimensions. For example, the P-channel transistors of NAND gate NAND1 have channel width 18 microns and channel length 1.2 microns. The N-channel transistors of NAND gate NAND1 have channel width 24 microns and channel length 1.0 micron. Each inverter is a CMOS inverter such as described in Wakerly, supra, at page 123. The numbers above each inverter show the P-channel width/length dimensions, and the numbers below the inverter show the N-channel width/length dimensions, all in microns.

Burst suspend signal BSUSP is the AND of BSTFBT and chip enable signal CEBLGC as shown in FIG. 12. Chip enable signal CEBLGC, active high, is generated from an external chip enable signal (not shown). BSTFBT and CEBLGC are inputs to NAND gate NAND121 whose output is inverted by inverter I121 providing BSUSP.

In non-burst mode, BSTFBT, CLKTP and CLKBT are all low (logical 0). In burst mode, BSTFBT is high, and CLKTP and CLKBT are the inverse of ATTLB0 (and hence are equal to A0) as long as BSUSP is low, that is, as long as CEBLGC is low. If in burst mode CEBLGC becomes high (time point 1010 in FIG. 10), BSUSP becomes high suspending the burst mode operation. CLKTP and CLKBT become zero. The burst mode is resumed when CEBLGC becomes low (point 1030 in FIG. 10).

Figure 13A:
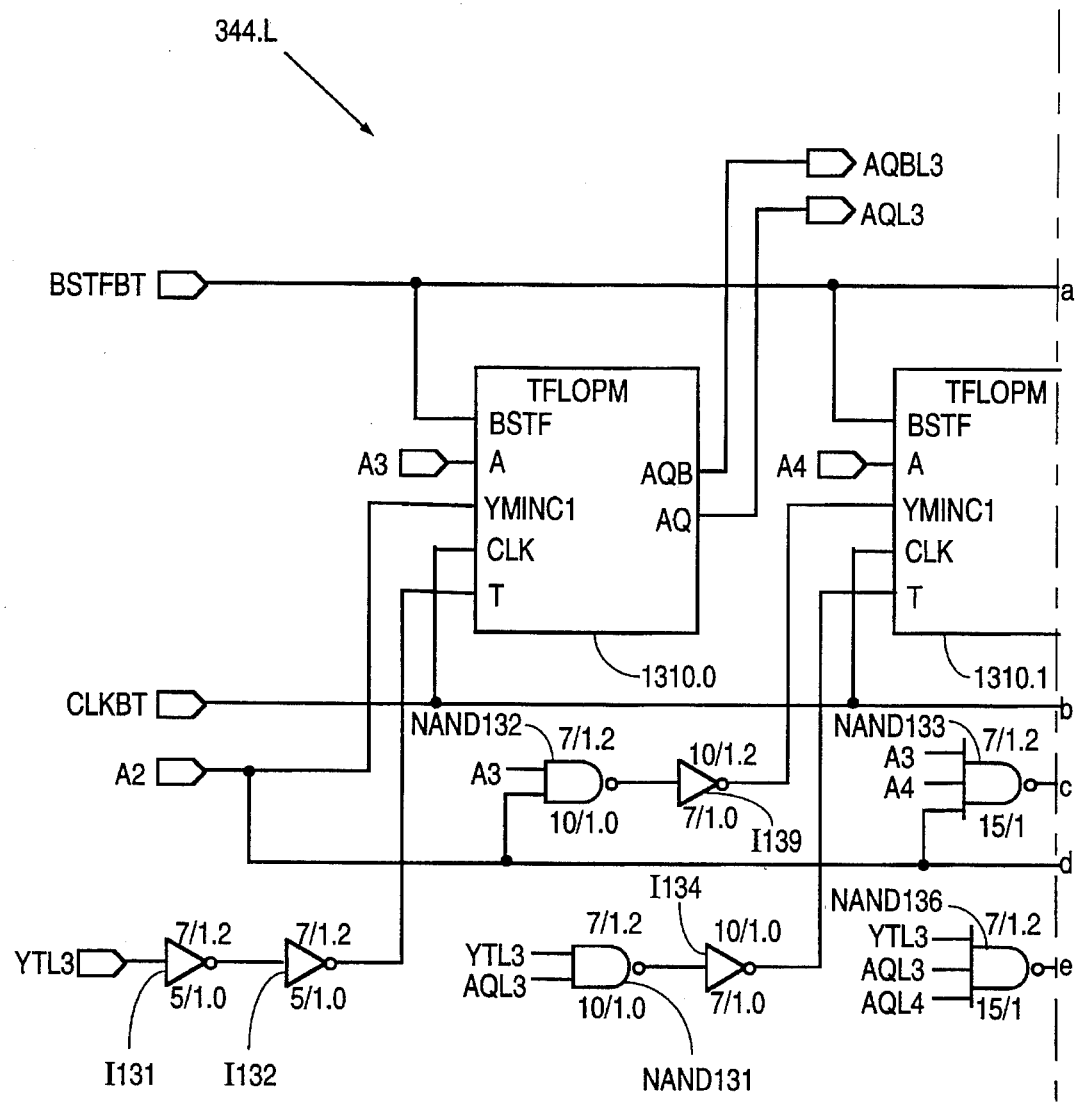
Figure 14:
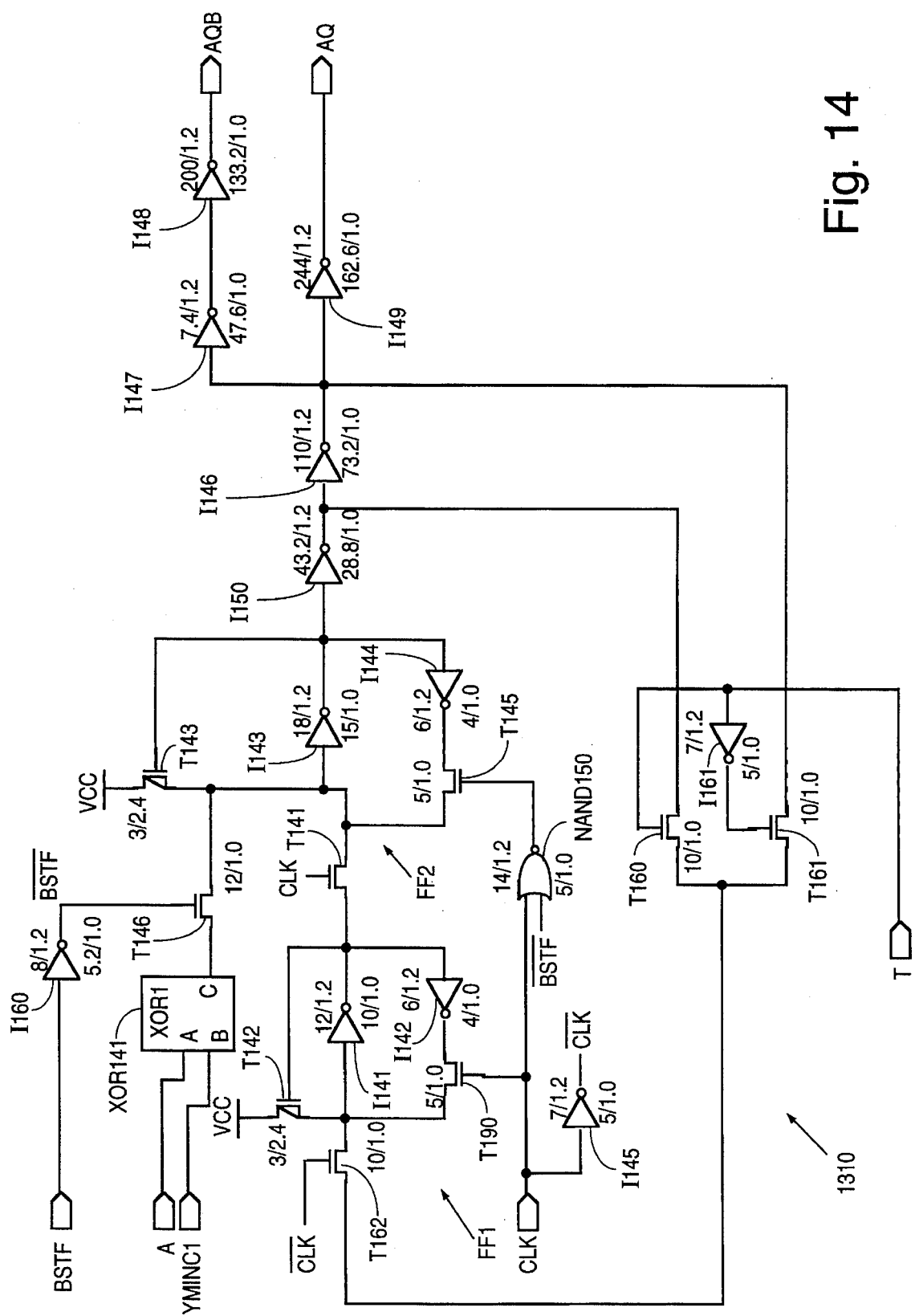
FIG. 14 illustrates portions of the Y-register of FIGS. 13A, 13B.

FIGS. 13 and 14 illustrate one embodiment of the Y-register 344.L. Y-register 344.L includes address circuits 1310, 1310.1, 1310.2 and 1310.3 which are copies of the same address circuit 1310.0 shown in FIG. 14. Address circuit 1310.0 generates AQL3 and AQBL3; address circuit 1310.1 generates AQL4 and AQBL4; address circuit 1310.2 generates AQL5 and AQBL5; and address circuit 1310.3 generates signals AQL6 and AQBL6. Inputs BSTF, A and CLK of each address circuit receive, respectively, BSTFBT, the respective one of address bits A3–A6, and CLKBT. Inputs T receive signals indicating whether to increment AQL3–AQL6. Inputs YMINC1 receive the signal used in non-burst mode as described below.

As shown in FIG. 14, address circuit 1310 includes dynamic flip-flops FF1 and FF2 connected in series through N-channel transistor T141. The numbers separated by a slash next to each transistor show the width/length of the transistor channel in microns.

Flip-flop FF1 includes cross-coupled inverters I141 and I142, P-channel transistor T142, and N-channel transistor T190. Flip-flop FF2 includes cross-coupled inverters I143, I144, P-channel transistor T143 and N-channel transistor T145. When the burst mode is off or suspended, transistor T141 is turned off by low clock CLK, and flip-flop FF1 is isolated from the rest of circuit 1310. BSTF is low, turning on, through inverter I160, transistor T146. The input A is supplied to output AQ through XOR gate XOR141, transistor T146, flip-flop FF2, and inverters I150, I146 and I149. Complementary output AQB is generated using inverters I147 and I148. If signal YMINC1 is low, AQ=A. YMINC1 is low except as described below. In non-burst mode, transistor T145 is turned off by the output of NOR gate NOR150, and the latching action of flip-flop FF2 is disabled.

In burst mode, BSTF is high turning off transistor T146. The inputs of flip-flops FF1 and FF2 are controlled, respectively, by signals $\overline{CLK}$ and CLK through respective transistors T162 and T141. Flip-flops FF1 and FF2 form a master-slave flip-flop. Signal $\overline{CLK}$ is generated from CLK by inverter I145.

When BSTF is first enabled high, CLK is low. Transistor T145 is on, and flip-flop FF2 latches the input A, so that AQ=A. The input of transistor T162 receives, through the circuit consisting of transistors T160, T161 and inverter I161, either the output of inverter I150 (equal to AQ) if T is high, or the output of inverter I146 (AQB) if T is low. On the next rising edge of clock CLK, the input of flip-flop FF1 is inverted and provided on output AQ. Thus if T is high, the next value of AQ is the complement of the previous value. If T is low, the next value of AQ is the same as the previous value.

As shown in FIG. 13, inputs T of address circuits 1310.0 through 1310.3 are connected so as to increment the column address AQL3–AQL6 when signal YTL3 is high. Signal YTL3 (FIG. 8), when high, enables pass transistor circuit 820.L-3 so as to select sense amplifier 330.L-3. On the next rising edge of clock CLKBT after selecting amplifier circuit 330.L-3, the column address AQL3–AQL6 is incremented. The next four columns of subarray 314.L are provided to sense amplifiers 330.L-0 through 330.L-3, while the outputs of sense amplifiers 330.R-i are provided to output buffer 336.

To increment the address AQL3–AQL6, the T input of circuit 1310.0 receives YTL3; the T input of circuit 1310.1 receives YTL3 AND AQL3 (through NAND gate NAND131 and inverter I134); the T input of circuit 1310.2 receives YTL3 AND AQL3 AND AQL4 (through NAND gate NAND136 and inverter I135); and the T input of circuit 1310.3 receives YTL3 AND AQL3 AND AQL4 AND AQL5 (through NAND gate NAND135 and inverter I136).

During a non-burst read from subarray 314.R, YMINC1 is used to make AQL3–AQL6 point to the next memory location in order to provide a burst read access if BSTFBT is enabled high. In subarray 314.R, A2=1. Accordingly, the YMINC1 inputs of the address circuits 1310.0 through 1310.3 are connected so that the column address AQL3–AQL6 would be 1 greater than address A3–A6 when A2=1. Namely, the YMINC1 inputs of circuits 1310.0–1310.3 are connected respectively to A2; A2 AND A3 "(through NAND gate NAND132 and inverter I139); A2 AND A3 AND A4 (through NAND gate NAND133 and inverter I138); and A2 AND A3 AND A4 AND A5 (through NAND gate NAND134 and inverter I137).

Figure 15A:
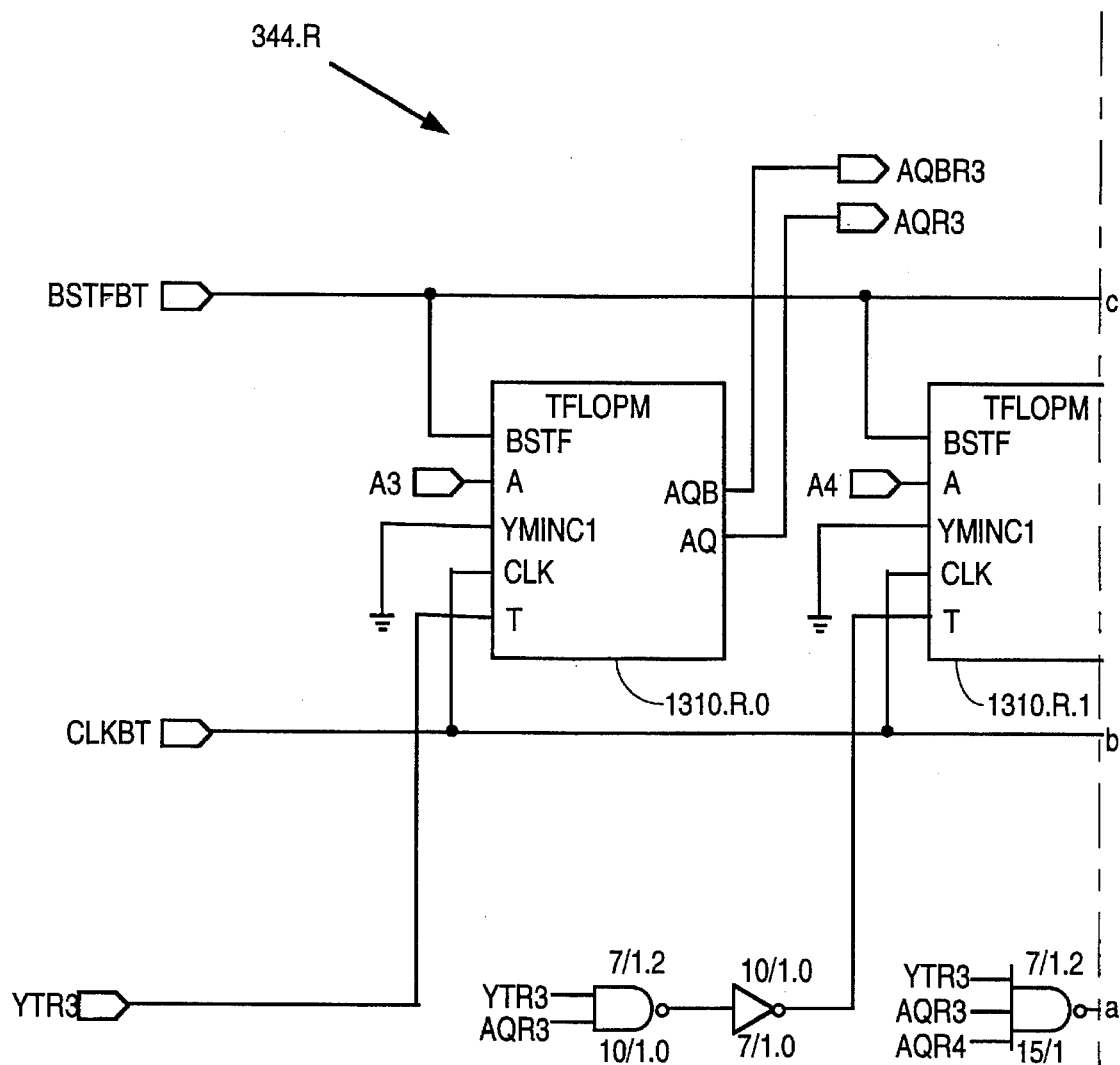

FIG. 15 shows a diagram of Y-register 344.R. Address circuits 1310.R.0 through 1310.R.3 are copies of address circuit 1310 of FIG. 14. Address circuits 1310.R.0 through 1310.R.3 provide, on respective outputs AQ and AQB, signals AQR3–AQR6 and complementary signals AQBR3–AQBR6. Y-register 344.R of FIG. 15 is identical to Y-register 344.L of FIG. 13 except: (1) inputs YMINC1 are grounded; and (2) YTL3 is replaced by YTR3 which is high when output of sense amplifier 330.R-3 is selected. In addition, YTR3 is provided to input T of address circuit 1310.R.0 directly and not through inverters.

Figure 16:
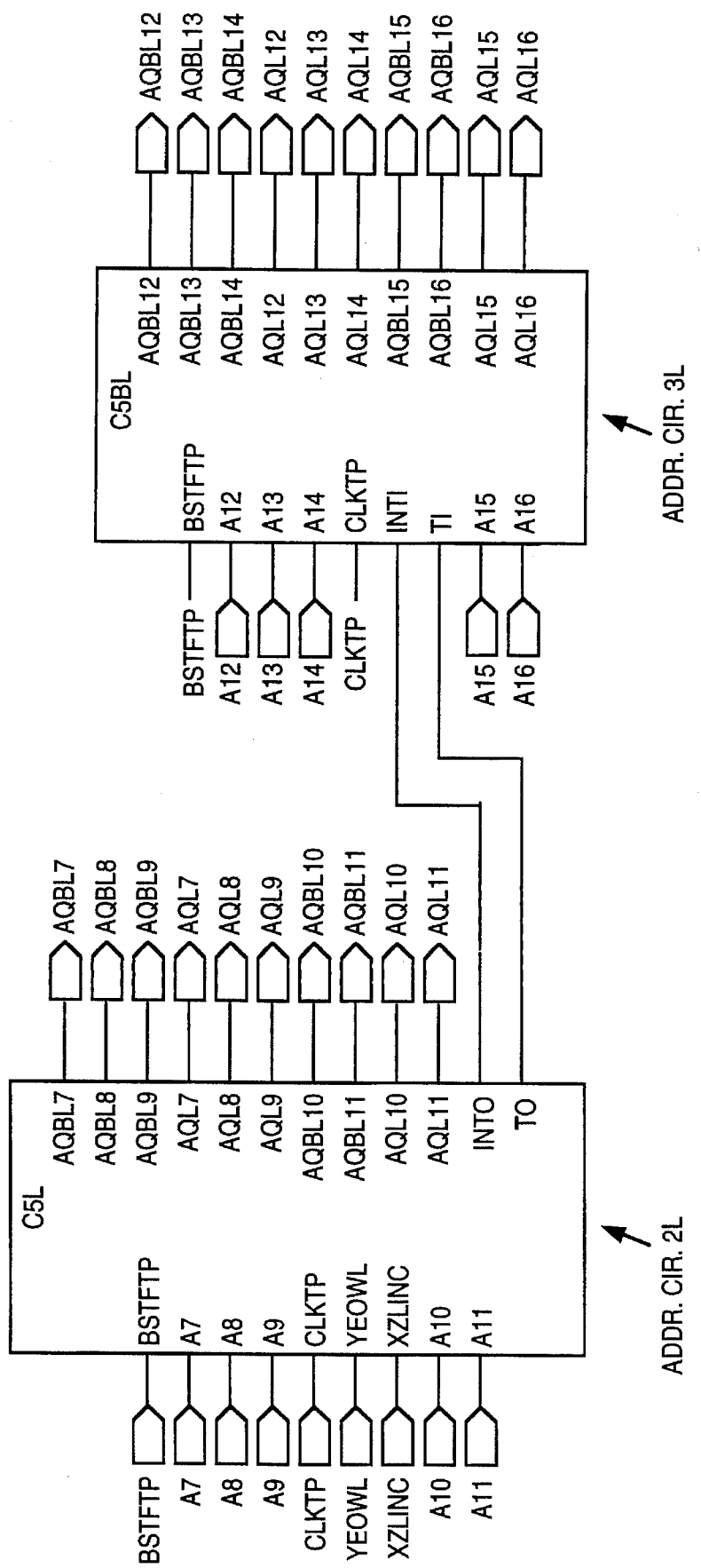
FIG. 16 diagrams an X-register of the memory of FIGS. 8A, 8B.
Figure 17A:
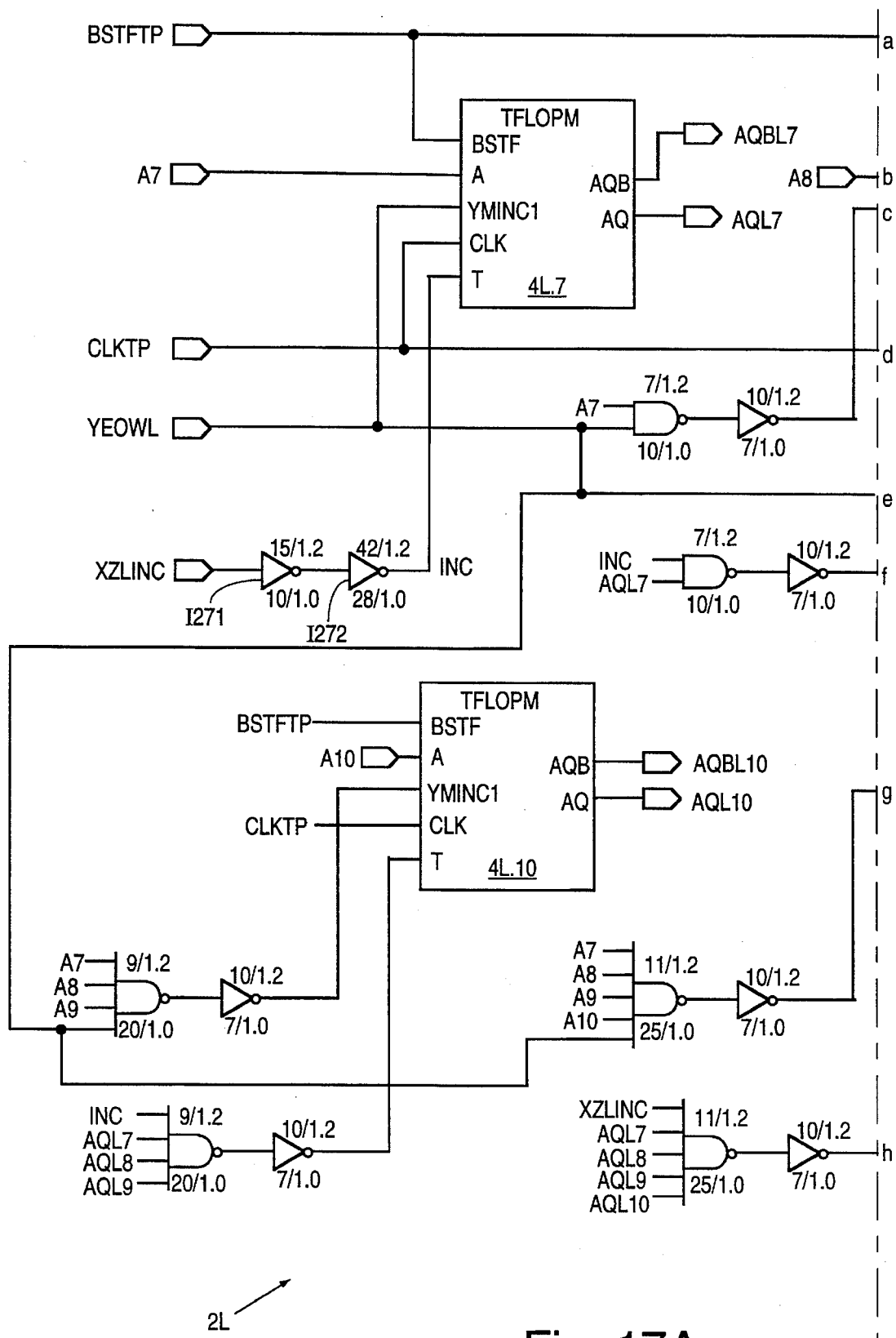
Figure 18A:
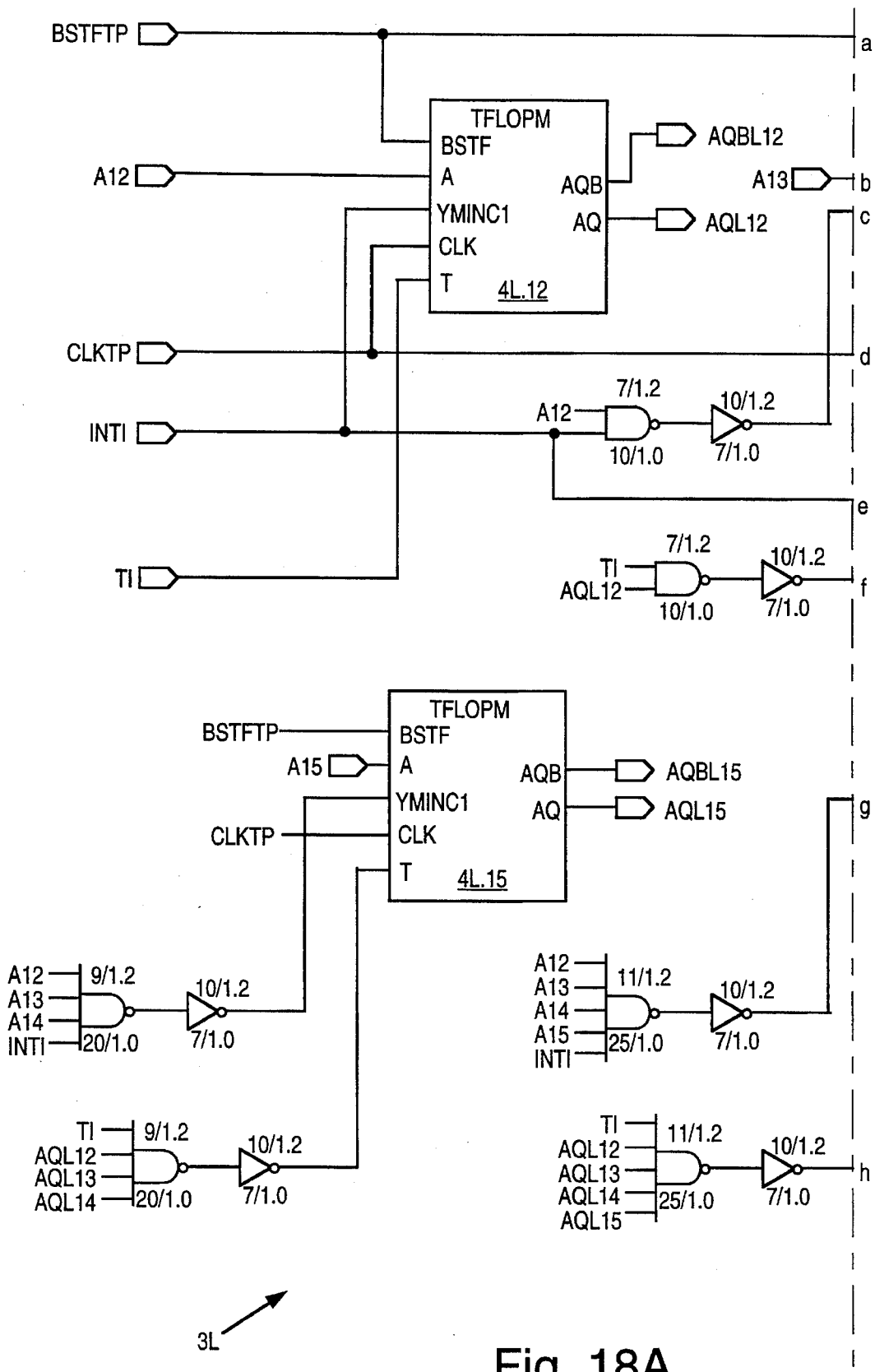
FIGS. 18A, 18B diagram a portion of the X-register of FIG. 16.
Figure 18B:
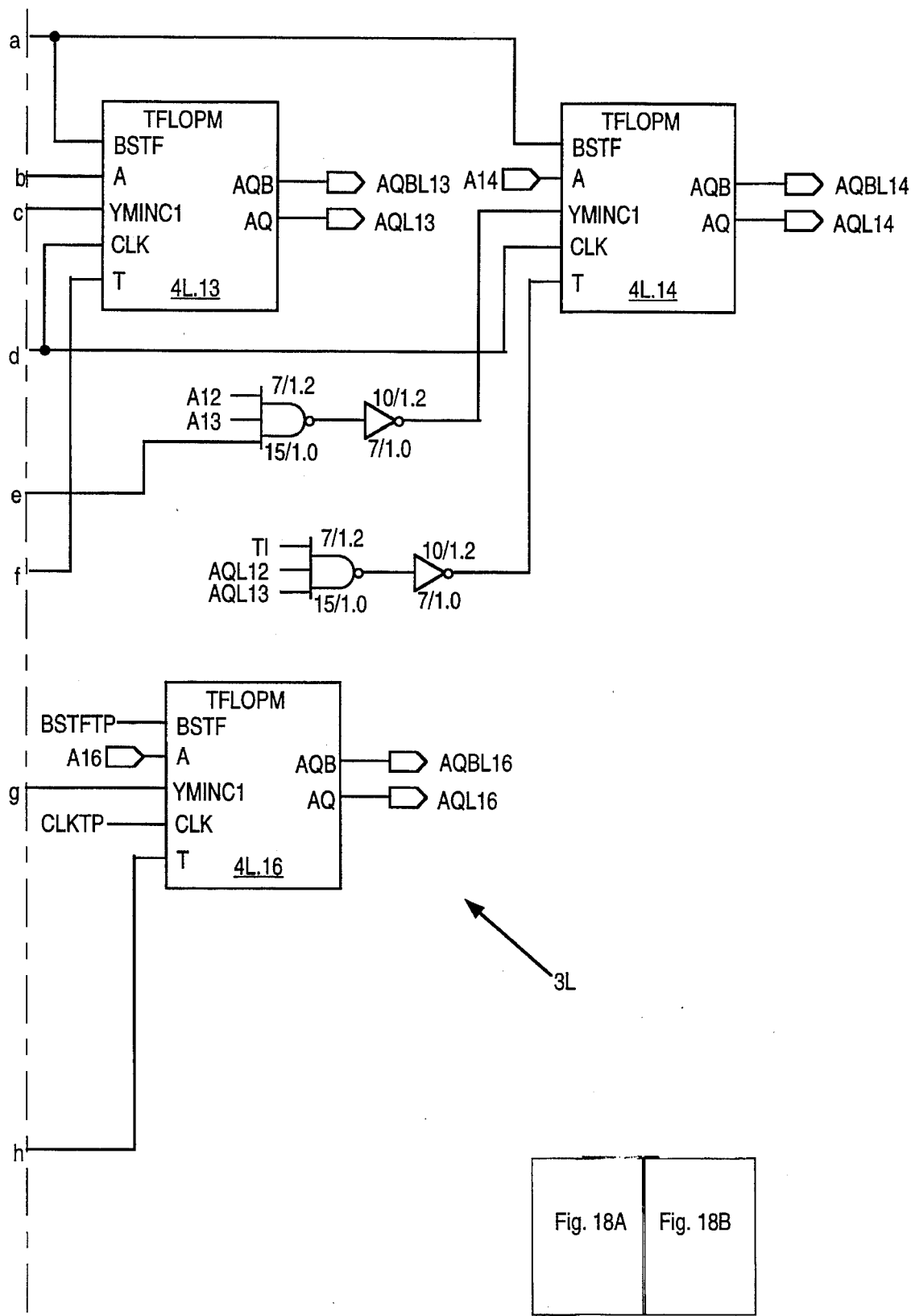

FIGS. 16–18 show one embodiment of X-register 340.L. X-register 340.L includes address circuits 2L and 3L. The circuit diagram of address circuit 2L is shown in FIG. 17, and the circuit diagram of address circuit 3L is shown in FIG. 18. Address circuit 2L receives inputs BSTFTP, A7–11, CLKTP, and inputs YEOWL and XZLINC described below, and generates signals AQL7–AQL11 and complementary signals AQBL7–AQBL11. Address circuit 2L generates also signals T0 and INT0 provided to respective inputs TI and INTI of address circuit 3L. Address circuit 3L further receives signals BSTFTP, A12–A16 and CLKTP. Address circuit 3L generates signals AQL12–AQL16 and the complementary signals AQBL12–AQBL16.

Figure 19:
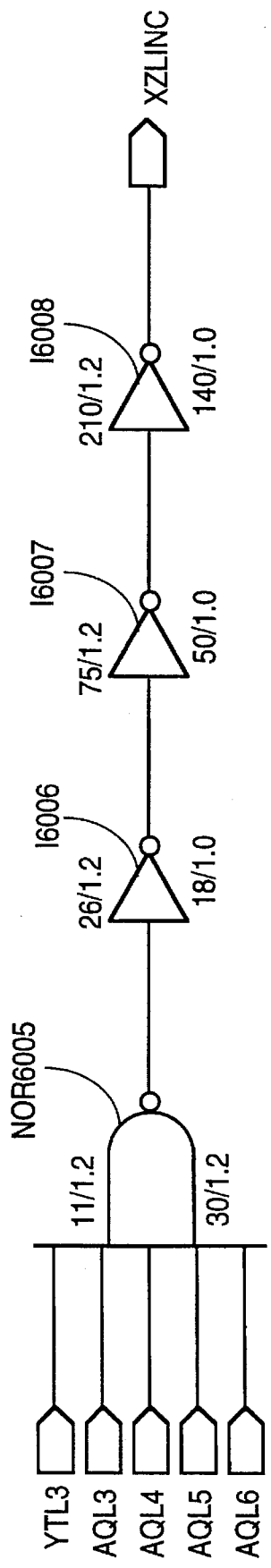
FIG. 19 diagrams a circuit generating a signal for the X-register of FIG. 16.

As shown in FIGS. 17 and 18, address circuits 2L and 3L include address circuits 4L.7 through 4L.16. Each circuit 4L.i is a copy of address circuit 1310 of FIG. 14. Each circuit 4L.i receives a corresponding input Ai and generates outputs AQLi and AQBLi. The BSTF inputs of circuits 4L.i are connected to BSTFTP, the CLK inputs are connected to CLKTP. The T inputs are connected so that the row address AQL7–AQL16 is incremented when signal XZLINC becomes high. XZLINC is generated as shown in FIG. 19 by ANDing signals YTL3 and AQL3–AQL6. When YTL3 is high, output buffer 336 reads from sense amplifier circuit 30.L-3, the last sense amplifier circuit in subarray 314.L. When AQL3–AQL6 are all high, the last address in the current row in left subarray 314.L has been read, and the next location in subarray 314.L must be read from the next row.

Figure 20:
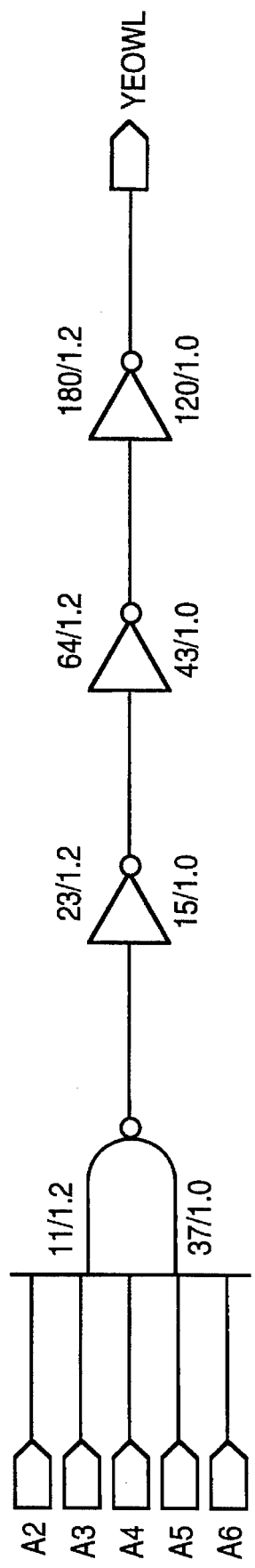
FIG. 20 diagrams a circuit generating a signal for the X-register of FIG. 16.

Inputs YMINC1 of circuits 4L.i are active during a non-burst mode read from right subarray 314.R to increment left row address AQL7–AQL16 when needed to point to the next location to prepare for possible entry into the burst mode. Namely, if signal YEOWL is low, AQL7–AQL16 point to the same row as AQR7–AQR16 (which equal A7–A16). If YEOWL is high, AQL7–AQL16 point to the next row. YEOWL is generated, as shown in FIG. 20, by ANDing signals A2–A6. When A2–A6 are all high, they address the last columns in each group 4 through 7, and hence if the burst mode is entered, the location to be read first from the subarray 314.L would be in the next row.

Figure 21:
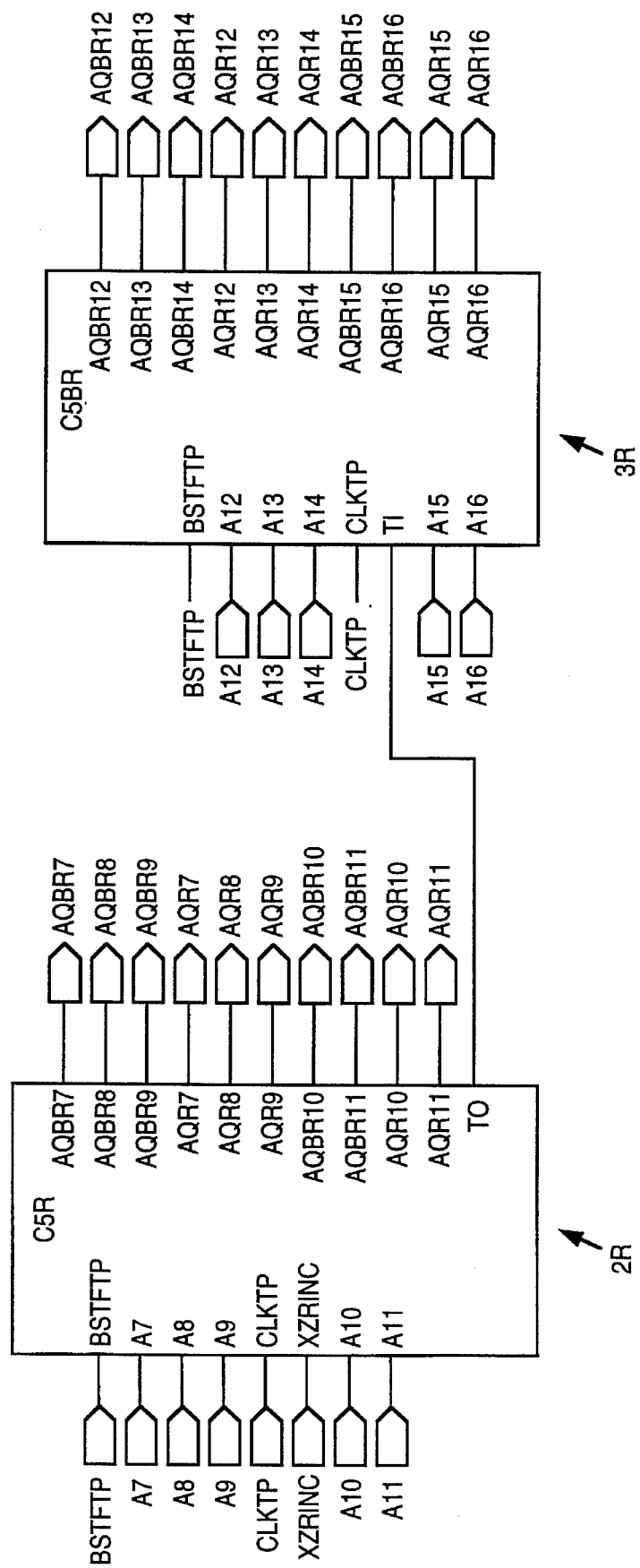
FIG. 21 diagrams an X-register of the memory of FIGS. 8A, 8B.
Figure 22A:
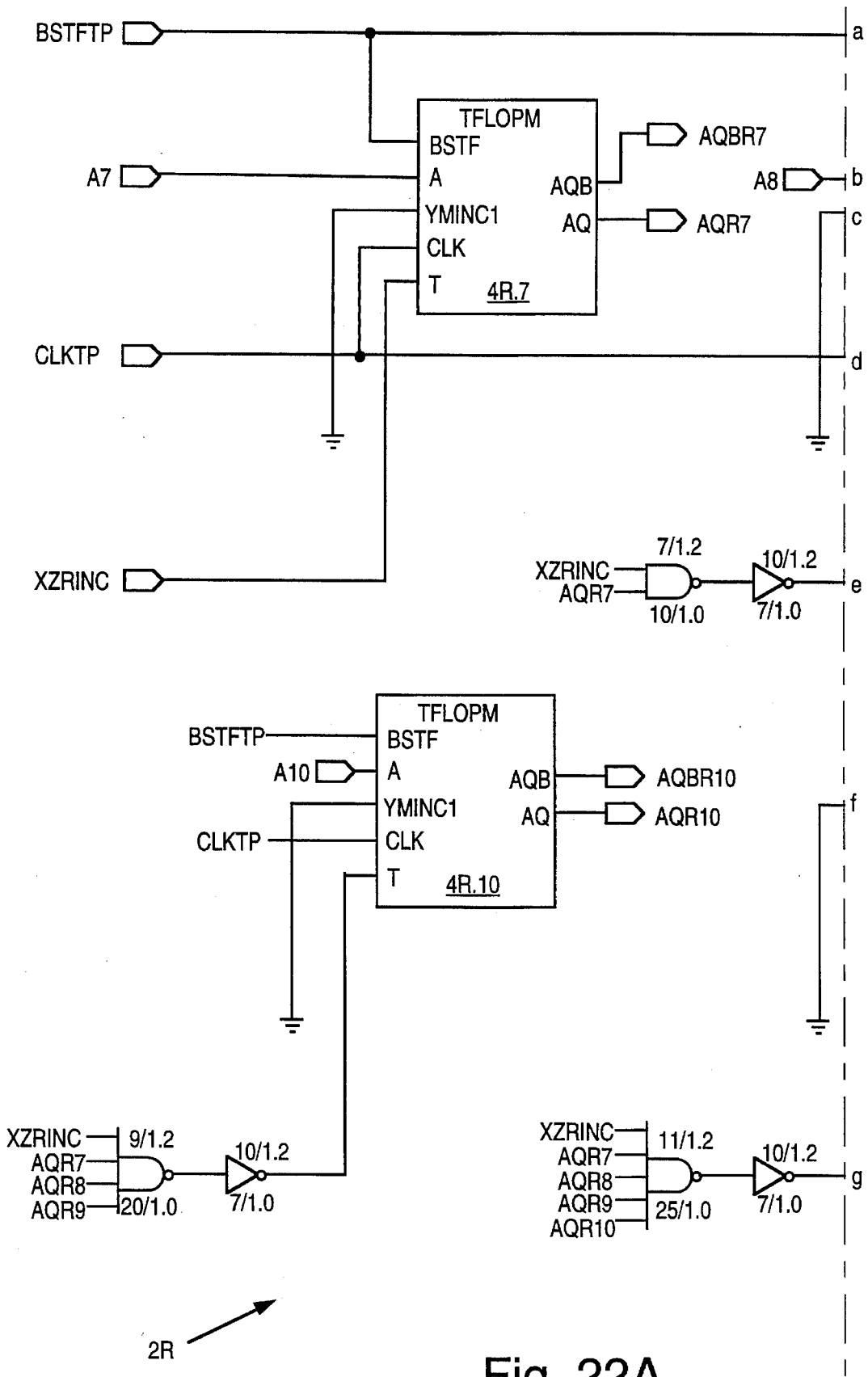
FIGS. 22A, 22B diagram a portion of the X-register of FIG. 21.
Figure 22B:
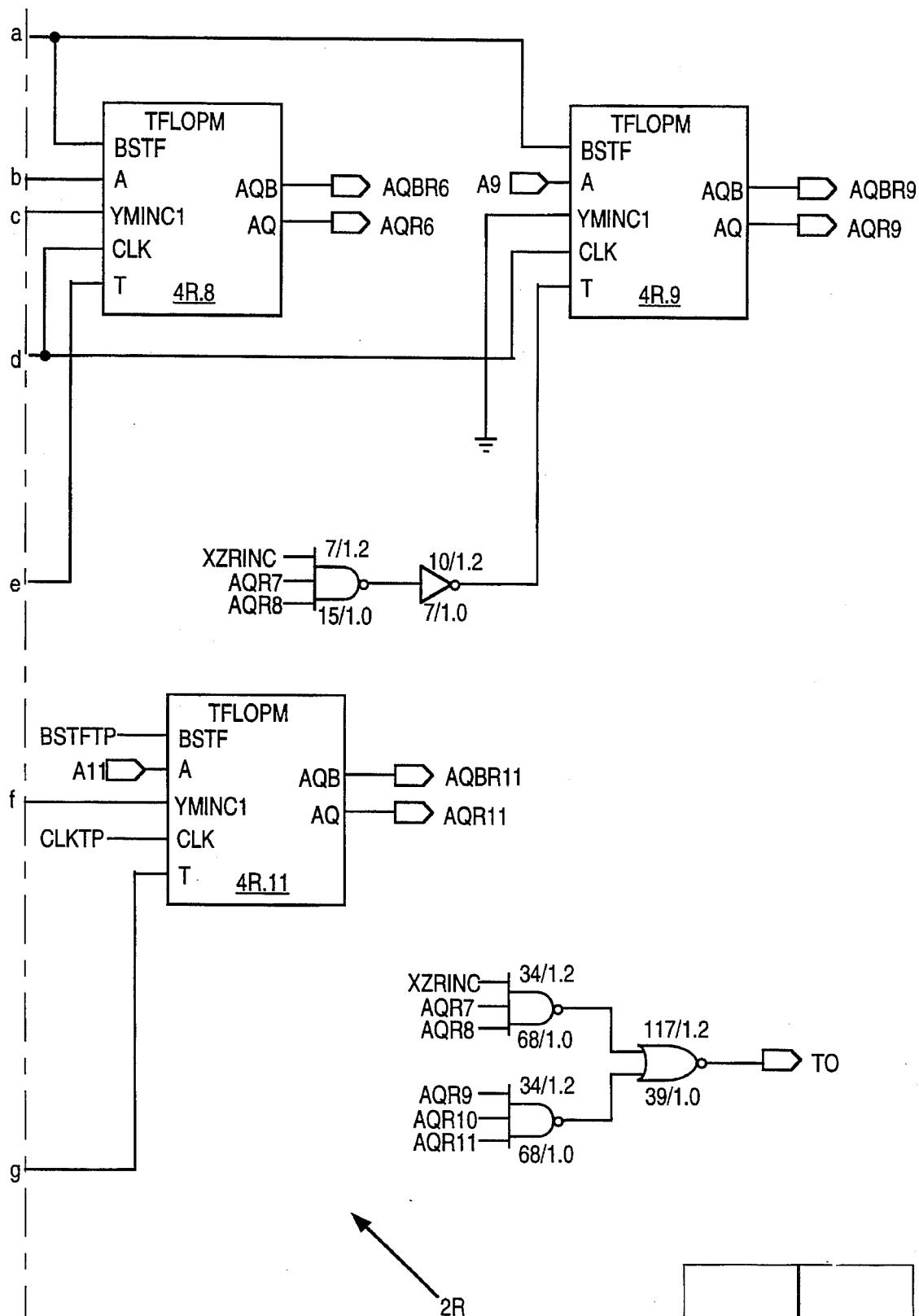
Figure 23A:
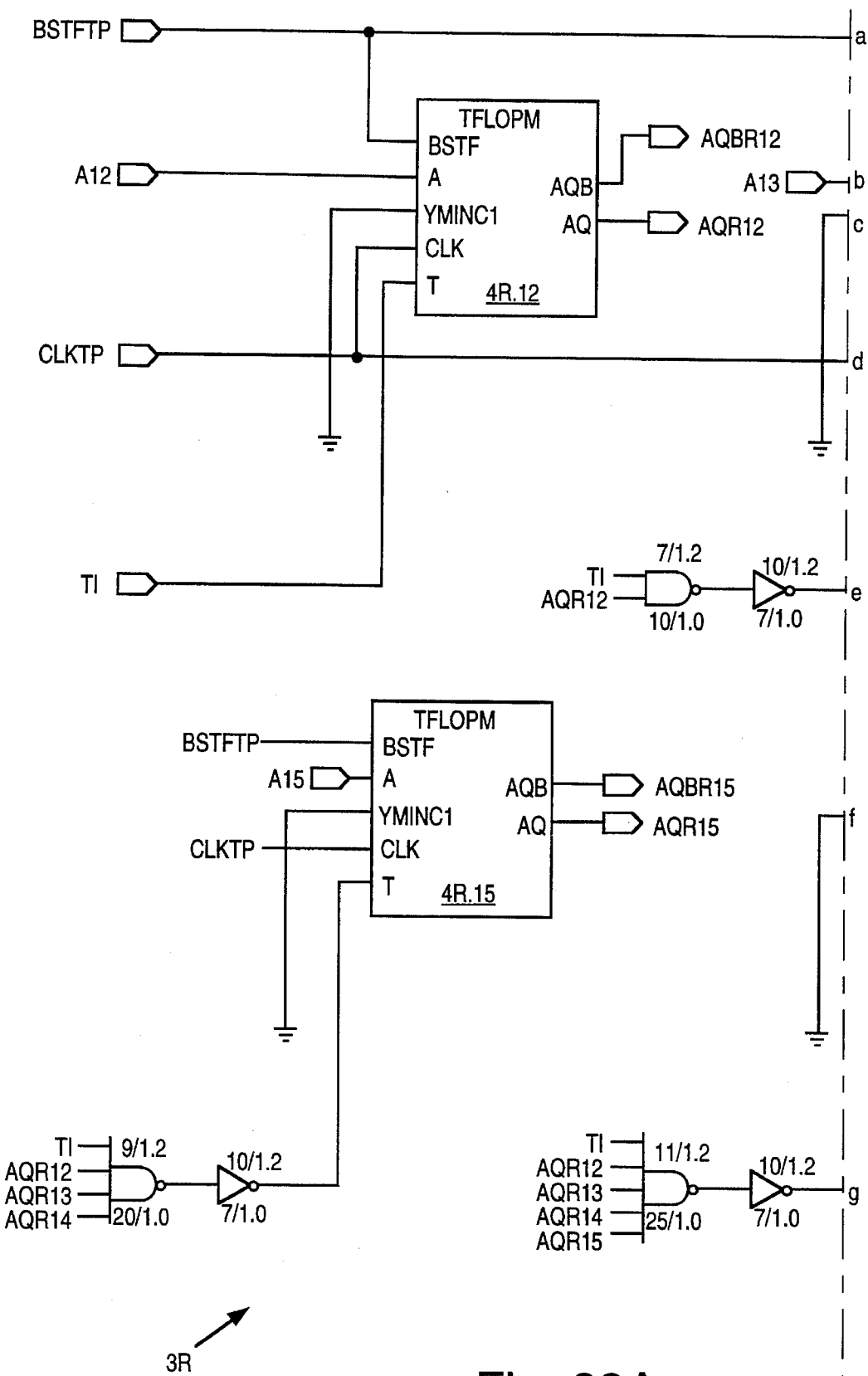
FIGS. 23A, 23B diagram a portion of the X-register of FIG. 21.
Figure 23B:
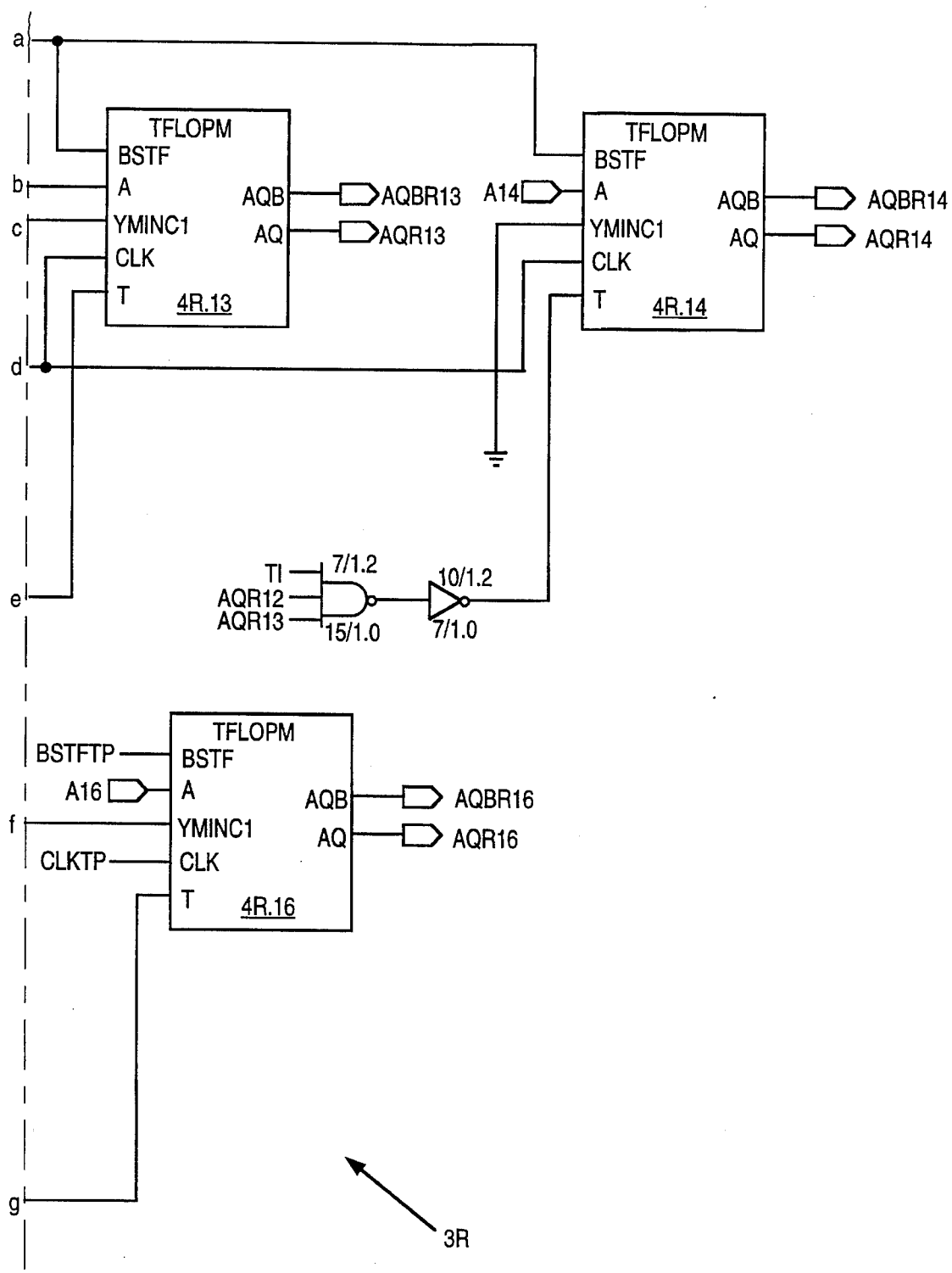

FIGS. 21–23 illustrate one embodiment of the X-register 340.4. X-register 340.R includes circuits 2R and 3R as shown in FIG. 21. Circuit 2R receives inputs BSTFTP, A7–A11, CLKTP and XZRINC and produces right row address signals AQR7–AQR11 and their compliments AQBR7–AQBR11. In addition, circuit 2R produces output T0 supplied to input TI of circuit 3R. Circuit 3R receives in addition signals BSTFTP, A12–A16 and CLKTP and produces signals AQR12–AQR16 and their complements AQBR12–AQBR16.

Figure 24:
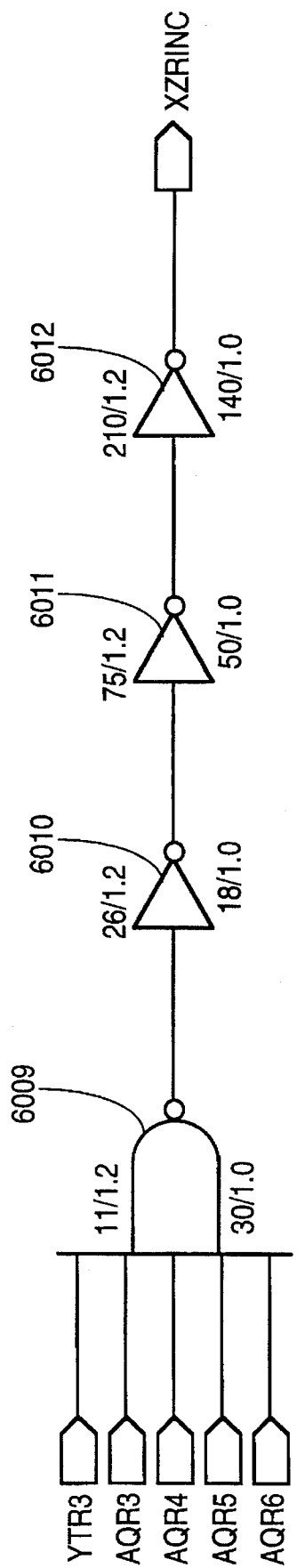
FIG. 24 diagrams a circuit generating a signal for the X-register of FIG. 21.

The circuit diagram of circuit 2R is shown in FIG. 22, and the circuit diagram of circuit 3R is shown in FIG. 23. Circuits 2R and 3R include address circuits 4R.7 through 4R.16 each of which is a copy of address circuit 1310 of FIG. 14. Each circuit 4R.i receives signal Ai and produces signals AQRi and AQBRi. In general, the circuits of FIGS. 22–23 are similar to X-register circuits of FIGS. 17–18 except: (1) inputs YMINC1 of circuits 4R.i are grounded so as not to increment the right row address in non-burst mode; in particular, signal INTO used to generate inputs YMINC1 in X-register 340.L is not present in X-register 340.R; and (2) XZRINC is used in place XZLINC. XZRINC is produced, as shown in FIG. 24, by ANDing the signals YTR3 and AQR3–AQR6. YTR3 is high when the data of the last sense amplifier 330.R-3 is transferred out to output buffer 336 (FIG. 8). AQR3–AQR6 are high when Y-select circuit 320.R selects the last column in each group 4 through 7. The next burst-mode read in subarray 314.R will be from the next row, and hence XZRINC is asserted high to increment the row address AQR7–AQR16.

Figure 25A:
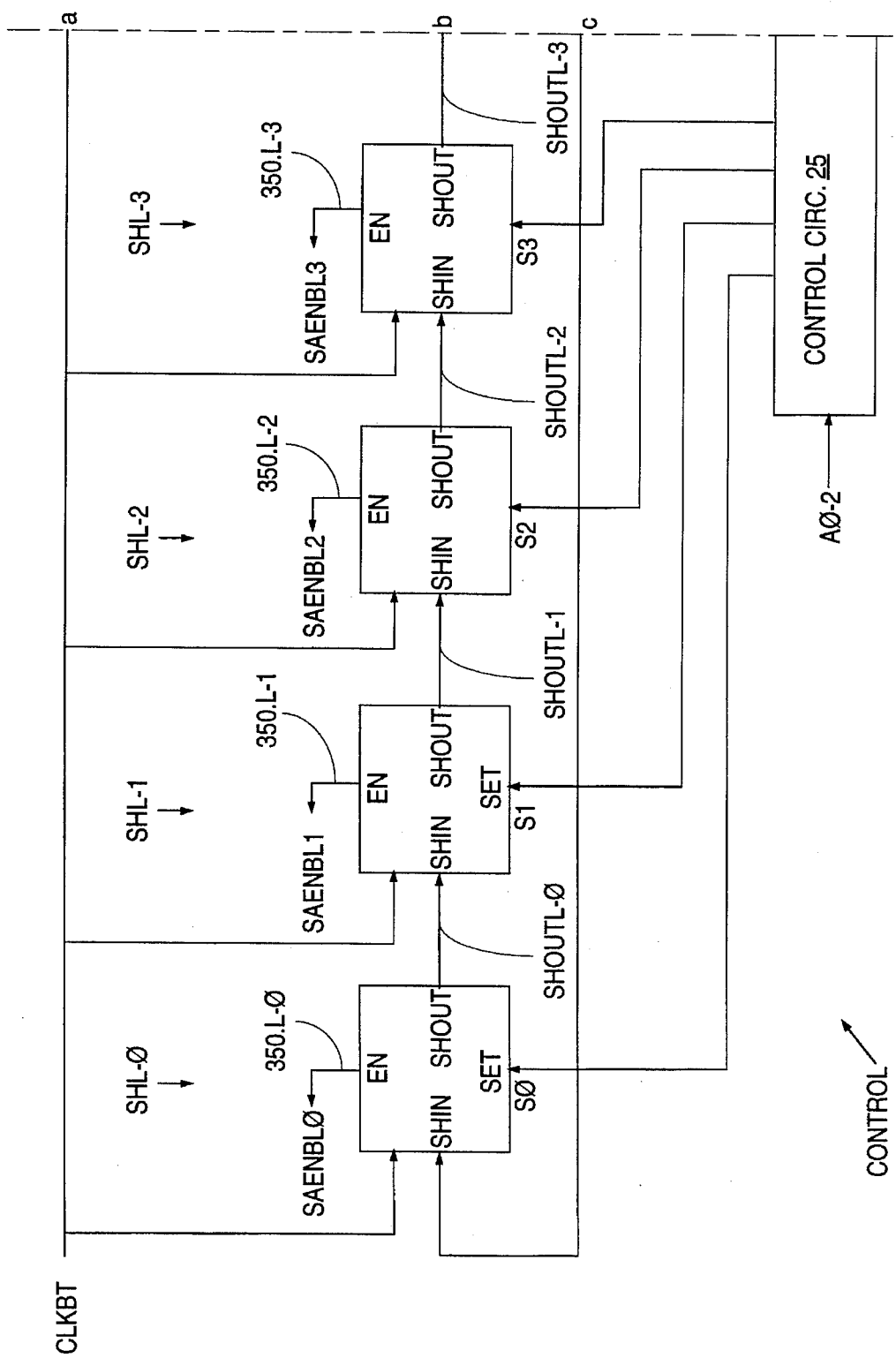
FIGS. 25A, 25B diagram a control circuit of the memory of FIGS. 8A, 8B.
Figure 25B:
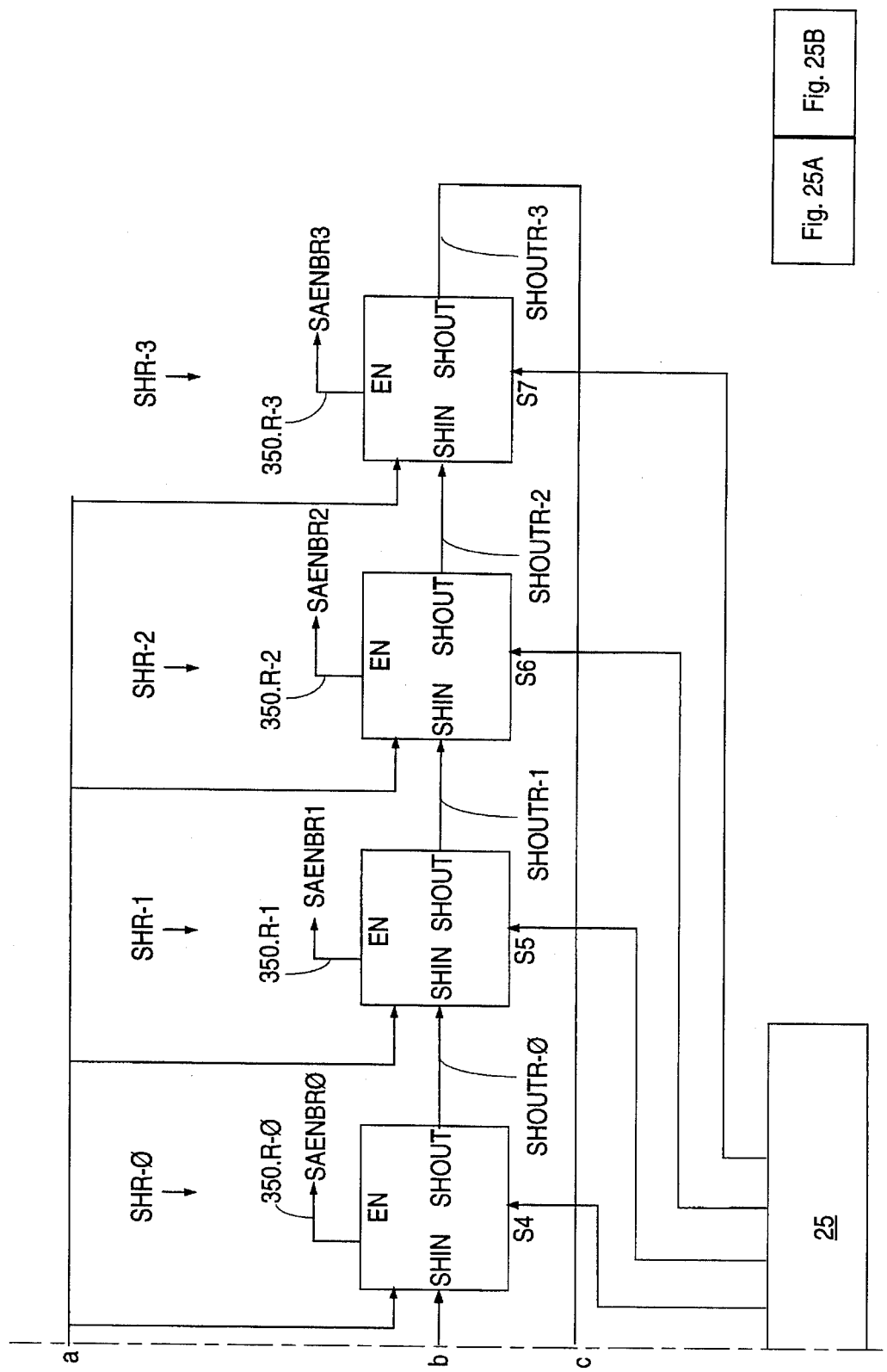

FIG. 25 shows one embodiment of control circuit 8. Cells SHL-0 through SHL-3 generate, on the respective lines 350.L-0 through 350.L-3, enable signals SAENBL0–SAENBL3 to respective sense amplifier circuits 330.L-0 through 330.L-3. When line 350.L-i is low, the sense amplifier circuit 330.L-i is enabled to develop the signal on its output. When the line 350.L-i is high, sense amplifier 330.L-i is disabled.

Similarly, cells SHR-0 through SHR-3 provide on the respective lines 350.R-0 through 350.R-3 the enable signals SAENBR0–SAENBR3 to the respective sense amplifier circuits 330.R-0 through 330.R-1.

Figure 26:
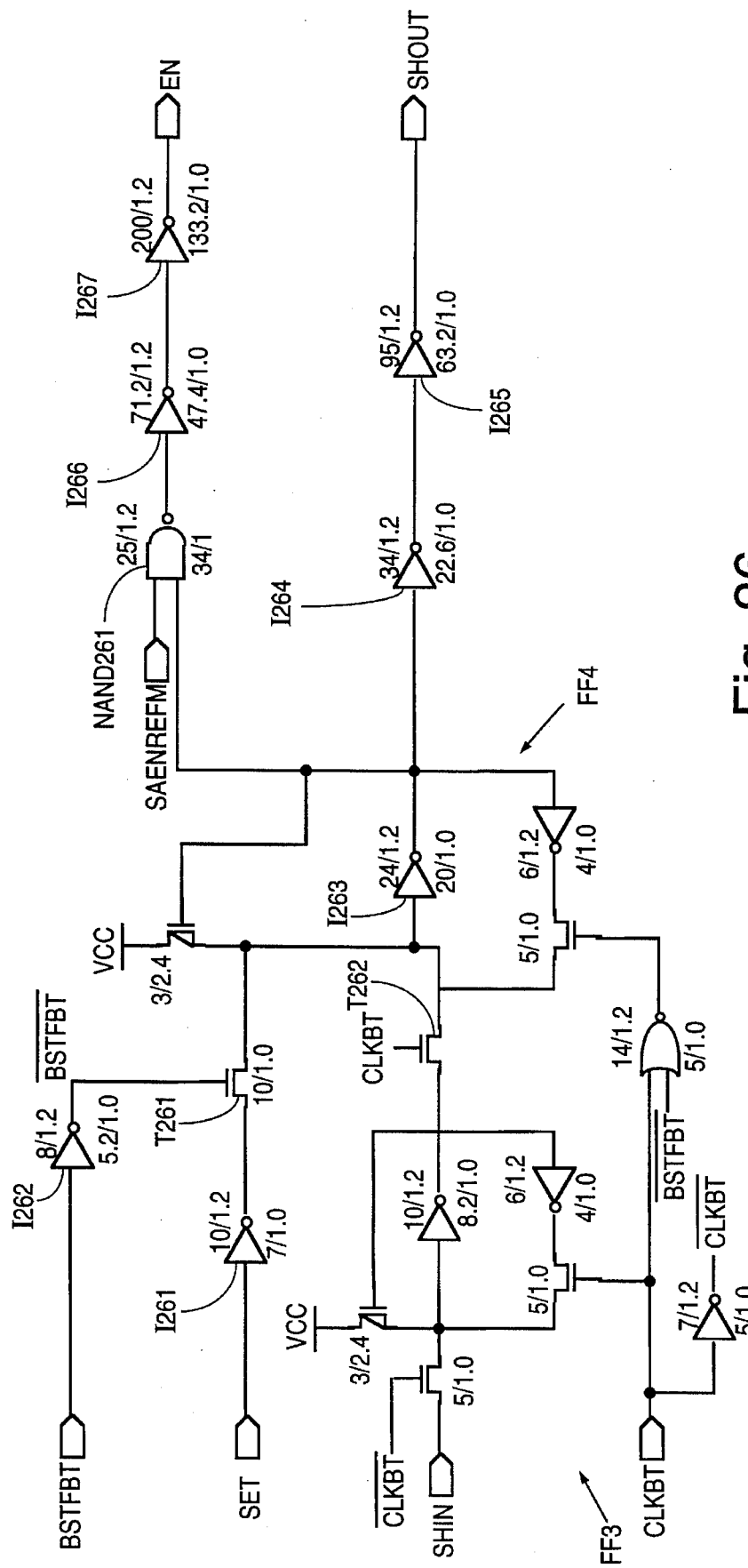
FIG. 26 illustrates portions of the control circuit of FIGS. 25A, 25B.

All the cells SHL-i, SHR-j are copies of the cell SH of FIG. 26. Cells SHL-i, SHR-j form a shift register. Input SHIN of cell SHL-0 is connected to output SHOUT of cell SHR-3. Input SHIN of each cell SHL-1 through SHR-3 is connected to output SHOUT of the respective cell SHL-0 through SHR-2. The clock inputs of all the cells are connected to CLKBT.

In burst mode, on the rising edge of CLKBT input SHIN is shifted to output SHOUT through the master-slave flip-flop consisting of flip-flops FF3, FF4. Flip-flops FF3, FF4 are similar to the respective flip-flops FF1, FF2 of FIG. 14. During reads, both in burst and random mode, signal SAENREFM (FIG. 26) is high so that output EN has the complement signal of output SHOUT. Outputs SHOUT are provided to control circuit 200 (FIG. 8) which generates signals YTL0–YTL3, YTR0–YTR3 to select one of the sense amplifier circuits 330.L-0 through 330.L-3, 330.R-0 through 330.R-3.

Figure 27:
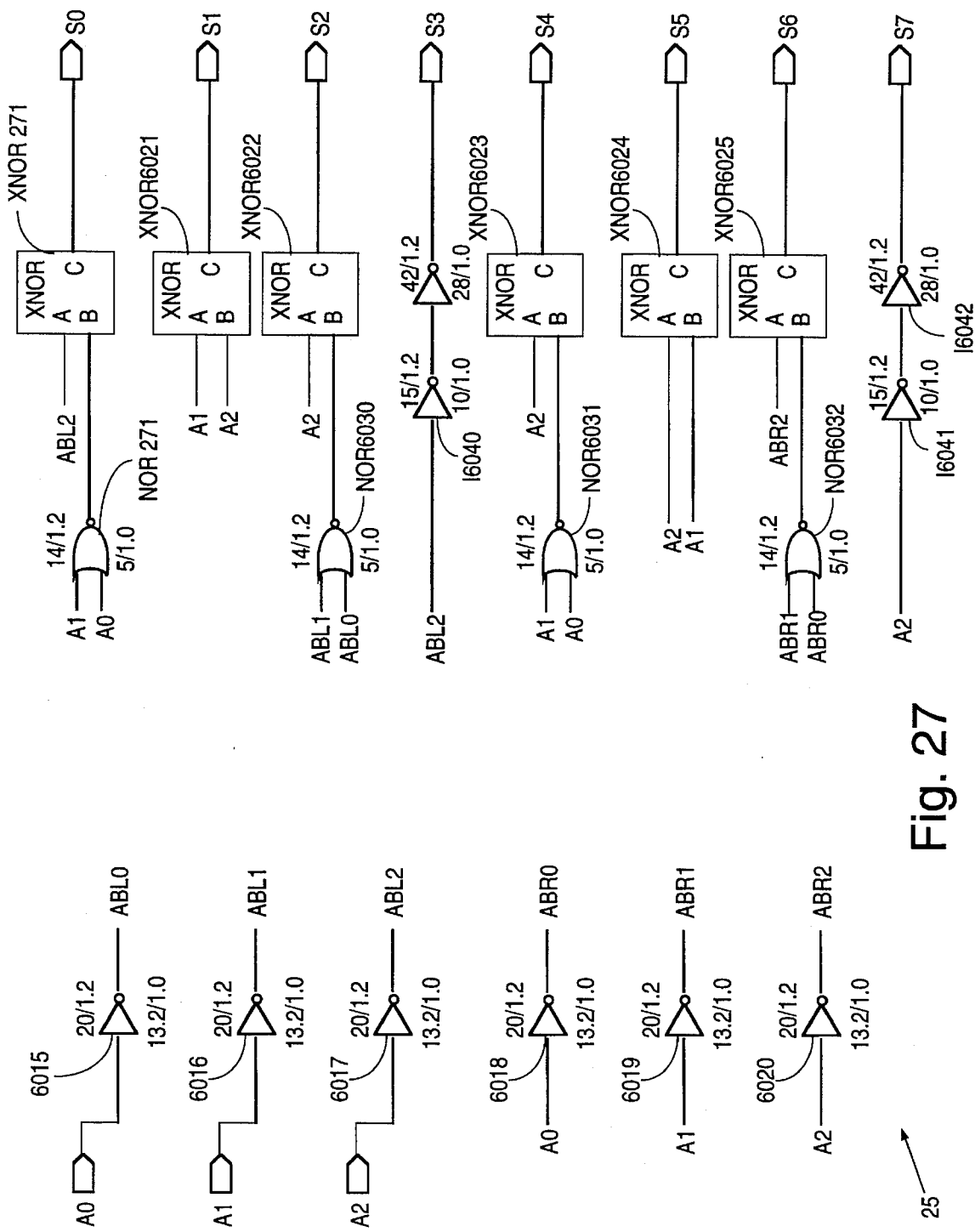
FIG. 27 diagrams a portion of the circuit of FIGS. 25A, 25B.

Control circuit 25 provides the initial values of outputs SHOUT on the respective lines S0–S8 connected to the SET inputs of the respective cells. Control circuit 25 (whose circuit diagram is shown in FIG. 27) determines the initial values from address inputs A0–A2 which determine the first sense amplifier circuit to be read out. Before the start of the burst mode, the respective SET inputs of the cells are passed to the respective outputs SHOUT through inverter I261 (FIG. 26), transistor T261 which is turned on by low BSTFBT through inverter I262, inverter I263 of flip-flop FF4 and inverters I264 and I265. SAENREFM is high, and so the SET input is provided on output EN through NAND gate NAND261 and inverters I266 and I267. During that time, CLKBT is low, and so flip-flop FF3 is isolated from flip-flop FF4 by transistor T262.

When BSTFBT is enabled high, transistor T261 isolates the SET input from the rest of the cell, and the cell provides the shifting operation on each rising edge of CLKBT.

Signal SAENREFM is asserted low in non-read operations (for example, during writes) to disable outputs EN and hence to disable all the sense amplifiers of circuits 330.L-i, 330.R-j, thereby reducing power consumption. During reads, SAENREFM enables the reference memory cell which is compared by each sense amplifier with the respective input from the memory array to determine whether the input represents 0 or 1.

During reads, SAENBLi, SAENBRj of shift register cells SHL-i, SHR-j turn on the sense amplifier circuit being read and the next three sense amplifier circuits so as to allow the next three sense amplifier circuits time to develop the output signals. Thus four consecutive outputs SHOUT of the cells (with wrap-around from cell SHR-3 to cell SHL-0) are 1's, and the other four are 0's. For example, when sense amplifier circuit 330.L-1 is being read out, SHOUTL-1 through SHOUTL-3 and SHOUTR-0 are high; SHOUTR-1 through SHOUTR-3 and SHOUTL-0 are low. On the rising edge of CLKBT, the four 1's are shifted to respective outputs SHOUTL-2, SHOUTL-3 and SHOUTR-0, SHOUTR-1. The remaining outputs SHOUT are 0.

Control circuit 25 determines the initial values S0–S7 from addresses A0–A2 as shown in FIG. 27. Control circuit 25 generates signals ABL0–ABL2 by inverting the respective signals A0–A2. Signals ABR0–ABR2 are also generated as the complements of respective signals A0–A2. Signals A1 and A0 are NORed by NOR gate NOR271 whose output is XNORed with ABL2 by XNOR gate XNOR271 to provide S0. XNOR is the complement of the exclusive OR operation (XOR). S1=A1 XNOR A2. S2=A2 XNOR (ABL0 NOR ABL1). S3=ABL2. S4=A2 XNOR (A0 NOR A1). S5=A1 XOR A2. S6=ABR2 XNOR (ABR0 NOR ABR1). S7=A2.

Figure 28:
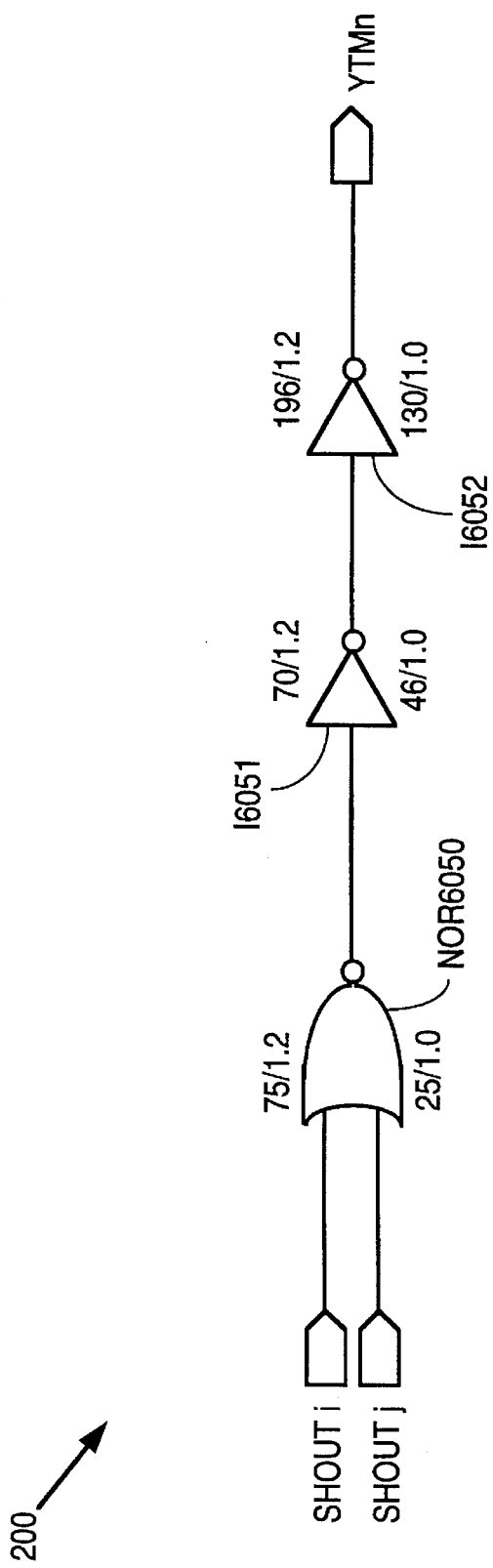
FIG. 28 illustrates a control circuit of the memory of FIGS. 8A, 8B.

FIG. 28 shows a circuit diagram of control circuit 200. Inputs SHOUTi, SHOUTj in FIG. 28 represent, for different i's and j's, signals SHOUTL-0 through SHOUTL-3 and SHOUTR-0 through SHOUTR-3 as shown in table TA1 in FIG. 28. Output YTMn represents outputs YTL0–YTL3, YTR0–YTR3 of control circuit 200. Control circuit 200 contains eight circuits such as the circuit of FIG. 28, one circuit for each output YTL0–YTL3, YTR0–YTR3. In each circuit, YTMn=SHOUTi NOR SHOUTj. Thus in the circuit providing YTMn=YTL0, SHOUTi is SHOUTR-0, and SHOUTj is SHOUTR-3 as shown in the first line of table TA1.

The reason for this logic is as follows. YTL0 must be high only when SHOUTL-0 through SHOUTL-3 are 1's and SHOUTR-0 through SHOUTR-3 are 0's. Since the four zeroes are always consecutive, SHOUTL-0 through SHOUTL-3 are all ones only if SHOUTR-0=SHOUTR-3=0, that is only if SHOUTR-0 NOR SHOUTR-3=1.

In general, YTMn, SHOUTi AND SHOUTj are matched as determined by Table TA1. In particular:

YTL0=SHOUTR-0 NOR SHOUTR-3

YTL1=SHOUTR-1 NOR SHOUTL-0

YTL2=SHOUTR-2 NOR SHOUTL-1

YTL3=SHOUTR-3 NOR SHOUTL-2

YTR0=SHOUTL-0 NOR SHOUTL-3

YTR1=SHOUTR-0 NOR SHOUTL-1

YTR2=SHOUTR-1 NOR SHOUTL-2

YTR3=SHOUTR-2 NOR SHOUTL-3

While the invention has been illustrated by the embodiments described above, these embodiments are illustrative only and are not intended to limit the scope of the invention. In particular, the invention is not limited by the type or size of the memory, nor by the transistor sizes. The invention is not limited to CMOS technology. Bipolar, BiCMOS, gallium arsenide and other technologies are within the scope of the invention. Further, some embodiments are not integrated into one integrated circuit. Other embodiments and variations are within the scope of the invention which is defined by the following claims.

What is claimed is:

1. A memory comprising:

a plurality of rows of memory locations;

a plurality of first registers, each first register for receiving a row address;

a plurality of row decoders, each row decoder for activating a portion of a row identified by signals from one of said first registers;

one or more sense amplifiers for amplifying contents of said memory locations in the row portions; and an output for providing output signals from said sense amplifiers, wherein at least two locations L1 and L2 in different rows having different row addresses in said memory can be read out to said output in burst mode such that the memory receives an address of one of said locations and provides in response contents of a plurality of memory locations, including the locations L1 and L2, in the sequence of consecutive addresses, so that while one of said row decoders is activating a row portion comprising said location L1 and contents of said location L1 are being transferred from one or more of said sense amplifiers to said output, another one of said row decoders is activating a row portion comprising said location L2 and contents of said location L2 are being transferred from said location L2 to one or more of said sense amplifiers.

2. The memory of claim 1, said memory having a random mode in which the memory receives an address and provides in response the contents of a unique memory location, wherein, both in burst mode and in random mode, while the contents of said location L1 are being transferred from one or more of said sense amplifiers to said output, the contents of said location L2 are being transferred from said location L2 to one or more of said sense amplifiers.

3. The memory of claim 1 wherein when the locations L1 and L2 are read out in burst mode and when the contents of said location L1 are being transferred from one or more of said sense amplifiers to said output and the contents of said location L2 are being transferred from said location L2 to one or more of said sense amplifiers, the sense amplifiers from which the contents of said location L1 are being transferred are enabled and the sense amplifiers to which the contents of said location L2 are being transferred are disabled, but these latter sense amplifiers become enabled subsequently for amplifying the contents of said location L2.

4. The memory of claim 1 wherein:

said memory comprises k pluralities S–1, . . . , S–k of locations wherein k is a number of said pluralities and is greater than or equal to two;

for each plurality S–i, said sense amplifiers can receive simultaneously the contents of number m of locations from said plurality S–i, wherein m is a positive integer; and time tARA does not exceed m * (k–1) * (tOE), wherein:

tARA is measured from the time that an address of a location is made available to said memory to the time when one or more of said sense amplifiers develop an output signal indicative of the contents of said location; and tOE is the time to transfer an output of any one of said sense amplifiers to said output of said memory.

5. The memory of claim 1 wherein, in burst mode, a time in which each location of said plurality except said one of said locations is read out to said output after a previous location has been read out to said output is shorter than a time in which said one of said locations is read out to said output after said address of said one of said locations has been received by said memory.

6. The memory of claim 1 wherein said memory is fabricated in an integrated circuit.

7. The memory of claim 1 further comprising:

a plurality of second registers, each second register for receiving at least a portion of a column address; and a circuitry for each second register for selecting in response to signals from one of the second registers a plurality of columns to be read by the sense amplifiers.

8. A memory comprising:

a set of consecutively addressed memory locations L1, . . . Ln;

a plurality of sense amplifier circuits for amplifying contents of said memory locations; and an output for providing output signals from said plurality of sense amplifier circuits, wherein said memory has a burst mode operation for receiving an address and reading out to said output, in response to said address, any given number of memory locations in the sequence of consecutive addresses with wrap around so that the next location, if any, to be read out after said location Ln is said location L1, such that during said operation while the contents of any location L to be read out other than the last location to be read out are being transferred from said plurality of sense amplifier circuits to said output, the contents of another location to be read out after said location L are being provided to said plurality of sense amplifier circuits for amplification and subsequent transfer to said output, and wherein said memory further comprises a control circuit for selectively enabling said sense amplifier circuits so that said control circuit enables a sense amplifier circuit whose output signals are being transferred to the output of said memory but said control circuit does not enable all said sense amplifier circuits at the same time.

9. The memory of claim 8 wherein, during said operation, said control circuit enables at the same time only:

(1) the sense amplifier circuit whose output signals are being transferred to said output of said memory, and (2) a predetermined number of other sense amplifier circuits whose output signals will be transferred next to said output of said memory if said operation continues sufficiently long.

10. The memory of claim 7 wherein:

said set of locations comprises k subsets S–1, . . . , S–k wherein k is greater than or equal to two, such that, for a positive integer m and for any subset S–i, the contents of m consecutively addressed locations from said subset S–i can be transferred simultaneously to said plurality of sense amplifier circuits; and in said operation, time tARA does not exceed m * (k−1) * (tOE), wherein:

tARA is measured from the time that an address of the first location to be read out in said operation is made available to said memory to the time when said plurality of sense amplifier circuits develops an output signal indicative of the contents of said first location; and tOE is the time to transfer the contents of any one of said locations from said plurality of sense amplifier circuits to said output.

11. The memory of claim 8 wherein, in said operation, each location to be read out except the first location to be read out is read out to said output in a shorter time than the first location to be read out.

12. The memory of claim 8 wherein the sequence of locations L1, ..., Ln is a sequence of increasing order of addresses.

13. The memory of claim 7 wherein in said operation any number of said locations addressed consecutively with wrap around can be read out to said output so that:

the first location to be read out in said operation is read out to said output after time tARA+tOE wherein:

tARA is measured from the time that an address of said first location is made available to said memory to the time when said plurality of sense amplifier circuits develops an output signal indicative of the contents of said first location; and tOE is the time to transfer the contents of any one of said locations from said plurality of sense amplifier circuits to said output of said memory; and every other location to be read out in said operation is read out to said output within time tOE.

14. The memory of claim 8 wherein said memory is fabricated in an integrated circuit.

15. In a memory having a plurality of rows of memory locations and having a plurality of row decoders and one X-register for each said row decoder, a method of reading in a burst mode operation a plurality of consecutively addressed memory locations spanning more than one row, said method comprising the steps of:

providing to said X-registers a row address of a first location to be read in said burst mode operation;

for each row containing a location to be read in said burst mode operation, performing the steps of:

providing by at least one of the X-registers to at least one of the row decoders signals identifying said row;

activating by one of said row decoders at least a portion of said row;

sensing and amplifying contents of at least one location of said row; and transferring amplified contents of at least one location of said row to an output of said memory;

wherein for at least two locations L1 and L2 of said plurality which are in different rows having different row addresses in said memory, the step of sensing and amplifying the contents of said location L2 overlaps in time with the step of transferring the amplified contents of said location L1 to said output of said memory.

16. The method of claim 15 wherein:

said memory comprises a plurality of sense amplifier circuits, and each sensing and amplifying step is performed by at least one of said sense amplifier circuits; and for at least two locations LL1 and LL2 of said plurality, during the step of transferring the amplified contents of said location LL1 to said output the sense amplifier circuit for sensing and amplifying the contents of said location LL1 is enabled and the sense amplifier circuit for sensing and amplifying the contents of said location LL2 is disabled, but said sense amplifier circuit for sensing and amplifying the contents of said location LL2 is enabled subsequently during the step of sensing and amplifying the contents of said location LL2.

17. The method of claim 15, further comprising the steps of:

providing at least a portion of a column address of the first location to be read in said operation to at least one of Y-registers of said memory; and providing, by at least one of the Y registers, signals identifying a plurality of columns of the memory such that memory locations in said plurality of columns in one row have consecutive addresses, wherein the sensing and amplifying step comprises the step of sensing and amplifying contents of memory locations in said plurality of columns.

18. The method of claim 17 wherein the transferring step comprises the step of transferring the amplified contents to the output consecutively in the sequence of addresses.

19. In a memory comprising a set of consecutively addressed memory locations L1, ..., Ln, and a plurality of sense amplifier circuits, a method of reading out in burst mode a sequence of locations addressed consecutively with wrap around so that the next location to be read out after location Ln is location L1, said method comprising the steps of:

receiving an address of a first location to be read out in burst mode; and in response to said address, for each location of said sequence performing the steps:

sensing and amplifying contents of said location; and transferring amplified contents of said location to an output of said memory, wherein for any location L of said sequence other than the last location to be read out in said sequence, the transferring step for the location L overlaps in time with the sensing and amplifying step for another location to be read out after said location L in said sequence; and for at least one location LL of said sequence, before the sensing and amplifying step for said location LL, the sense amplifier circuit which is to perform the sensing and amplifying step for the location LL is enabled, and after the transferring step for location LL, the sense amplifier circuit that has performed the sensing and amplifying step for location LL is disabled, and another sense amplifier circuit which is to perform the sensing and amplifying step for another location to be read out in said sequence is enabled.

20. An integrated memory comprising:

an array of memory locations, the array comprising a plurality of subarrays, each subarray comprising a predetermined number of groups of columns of the memory locations such that for any given column position in a group, the memory locations in any given row in the columns at said given position in the groups of the subarray have consecutive addresses;

one X-decoder for each subarray;

one X-register for each X-decoder;

one Y-decoder for each subarray;

one Y-register for each Y-decoder;

one Y-select circuit for each subarray, the Y-select circuit being responsive to the Y-decoder of the subarray to select all the columns that occupy a selected position in the groups of the subarray;

a plurality of sense amplifier circuits for each subarray, each sense amplifier circuit for amplifying signals from a column selected by the Y-select circuit of the subarray;

a memory output; and a control circuit for selecting one of the sense amplifier circuits to provide data to the memory output, wherein in a burst mode read operation, at least one X-register provides to its respective X-decoder signals identifying a row in one of the subarrays, and at least one Y-register provides to its respective Y-decoder signals identifying a position of columns in the groups of one of the subarrays.

21. The memory of claim 20 wherein said subarrays are two in number.

22. The memory of claim 20 wherein in the burst mode read operation while data from the sense amplifier circuits of one of the subarrays are provided to the memory output, the sense amplifier circuits of another one of the subarrays develop output signals corresponding to data in said other one of the subarrays.

23. The memory of claim 20 wherein in the burst mode read operation, the control circuit enables the sense amplifier circuit selected to provide data to the memory output and at the same time disables one or more sense amplifier circuits not selected to provide data to the memory output.

* * * * *

UNITED STATES PATENT AND TRADEMARK OFFICE
CERTIFICATE OF CORRECTION

PATENT NO. : 5,559,990
DATED : September 24, 1996
INVENTOR(S) : Pearl P. Cheng, Michael S. Briner and James C. Yu It is certified that error appears in the above-identified patent and that said Letters Patent is hereby corrected as shown below:

Col. 4, line 40,
Delete "340.L" (second occurrence) and insert --340.R--;

Col. 4, line 40,
At the end of the line, delete "340.R" and insert --340.L--;

Col. 8, line 61,
Delete "1310.0" and insert --1310--; and

Col. 10, line 59,
Delete "340.4" and insert --340.R--.

Signed and Sealed this

Fourth Day of March, 1997

BRUCE LEHMAN

Attest:

Attesting Officer

Commissioner of Patents and Trademarks

UNITED STATES PATENT AND TRADEMARK OFFICE
CERTIFICATE OF CORRECTION

PATENT NO. : 5,559,990  
APPLICATION NO. : 08/328337  
DATED : September 24, 1996  
INVENTOR(S) : Pearl P. Cheng, Michael S. Briner and James C. Yu It is certified that error appears in the above-identified patent and that said Letters Patent is hereby corrected as shown below:

Column 14, Line 61,
 Delete "7" and insert --8--; and

Column 15, Line 18,
 Delete "7" and insert --8--.

Signed and Sealed this

Eighteenth Day of November, 2008

JON W. DUDAS  
*Director of the United States Patent and Trademark Office*